(12) United States Patent
Wang et al.

(10) Patent No.: US 10,867,799 B2
(45) Date of Patent: Dec. 15, 2020

(54) FINFET DEVICE AND METHODS OF FORMING SAME

(71) Applicant: Taiwan Semiconductor Manufacturing Company, Ltd., Hsinchu (TW)

(72) Inventors: Chun Chieh Wang, Kaohsiung (TW); Zheng-Yang Pan, Zhubei (TW); Shih-Chieh Chang, Taipei (TW); Cheng-Han Lee, New Taipei (TW); Huai-Tei Yang, Hsinchu (TW); Shahaji B. More, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/701,805

(22) Filed: Dec. 3, 2019

(65) Prior Publication Data
US 2020/0105534 A1    Apr. 2, 2020

Related U.S. Application Data

(62) Division of application No. 15/964,253, filed on Apr. 27, 2018, now Pat. No. 10,522,358.

(60) Provisional application No. 62/552,886, filed on Aug. 31, 2017.

(51) Int. Cl.
| | | |
|---|---|---|
| *H01L 21/28* | (2006.01) | |
| *H01L 29/66* | (2006.01) | |
| *H01L 27/092* | (2006.01) | |
| *H01L 21/3215* | (2006.01) | |
| *H01L 29/51* | (2006.01) | |
| *H01L 29/78* | (2006.01) | |

(Continued)

(52) U.S. Cl.
CPC .. *H01L 21/28185* (2013.01); *H01L 21/28088* (2013.01); *H01L 21/28247* (2013.01); *H01L 21/3215* (2013.01); *H01L 21/823821* (2013.01); *H01L 21/823857* (2013.01); *H01L 27/0924* (2013.01); *H01L 29/4966* (2013.01); *H01L 29/517* (2013.01); *H01L 29/66795* (2013.01); *H01L 29/785* (2013.01); *H01L 21/28194* (2013.01)

(58) Field of Classification Search
CPC ............ H01L 29/517; H01L 29/66545; H01L 29/51; H01L 21/823857; H01L 21/28185; H01L 21/324
See application file for complete search history.

(56) References Cited

U.S. PATENT DOCUMENTS

| | | |
|---|---|---|
| 2007/0037343 A1 | 2/2007 | Colombo et al. |
| 2007/0152252 A1 | 7/2007 | Buehler et al. |
| 2008/0132067 A1 | 6/2008 | Ma |

(Continued)

*Primary Examiner* — Zandra V Smith
*Assistant Examiner* — John M Parker
(74) *Attorney, Agent, or Firm* — Slater Matsil, LLP

(57) ABSTRACT

A FinFET device and method of forming the same are disclosed. The method includes forming a gate dielectric layer and depositing a metal oxide layer over the gate dielectric layer. The method also includes annealing the gate dielectric layer and the metal oxide layer, causing ions to diffuse from the metal oxide layer to the gate dielectric layer to form a doped gate dielectric layer. The method also includes forming a work function layer over the doped gate dielectric layer, and forming a gate electrode over the work function layer.

20 Claims, 44 Drawing Sheets

(51) Int. Cl.
 *H01L 29/49* (2006.01)
 *H01L 21/8238* (2006.01)

(56) References Cited

U.S. PATENT DOCUMENTS

| | | |
|---|---|---|
| 2010/0197128 A1 | 8/2010 | Schaeffer et al. |
| 2011/0101438 A1 | 5/2011 | Yoo et al. |
| 2012/0043614 A1 | 2/2012 | Choi et al. |
| 2013/0017678 A1 | 1/2013 | Tsai et al. |
| 2013/0062704 A1* | 3/2013 | Cheng ............... H01L 29/66606 257/369 |
| 2013/0078793 A1 | 3/2013 | Sun et al. |
| 2013/0154019 A1 | 6/2013 | Ando et al. |
| 2013/0288435 A1 | 10/2013 | Kelwing et al. |
| 2015/0024585 A1 | 1/2015 | Lou et al. |
| 2015/0035084 A1 | 2/2015 | Li et al. |
| 2016/0315164 A1 | 10/2016 | Son et al. |

\* cited by examiner

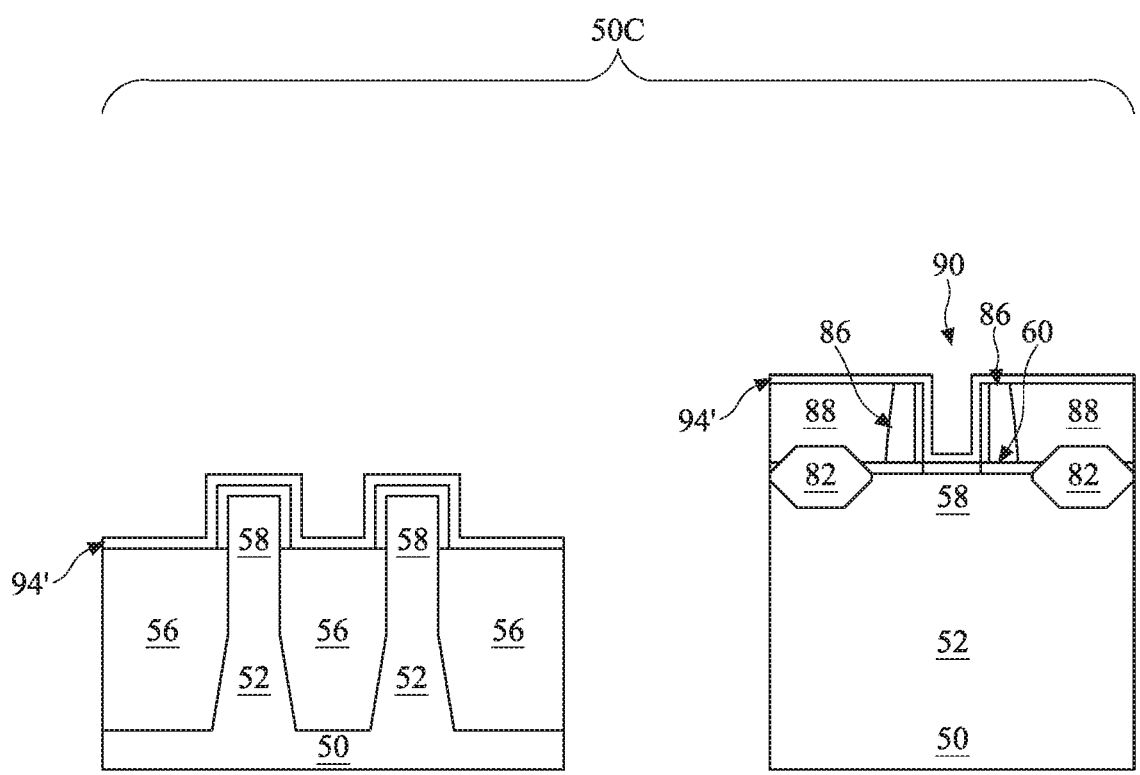

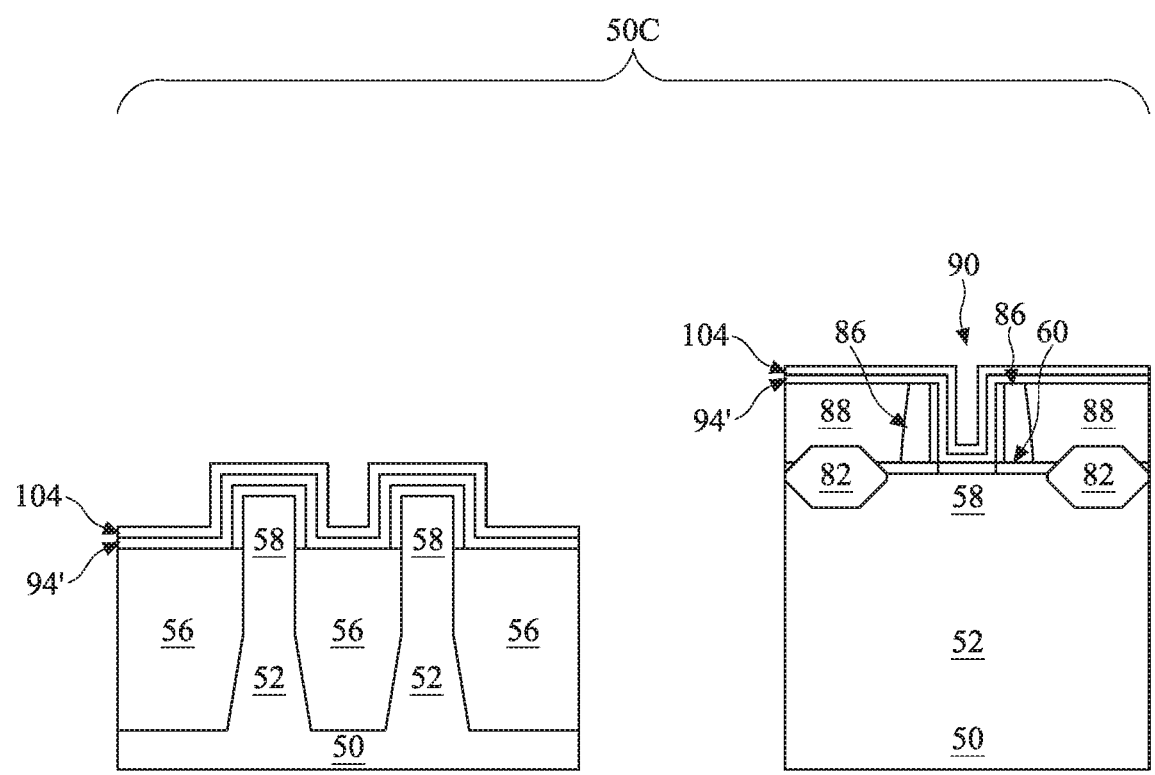

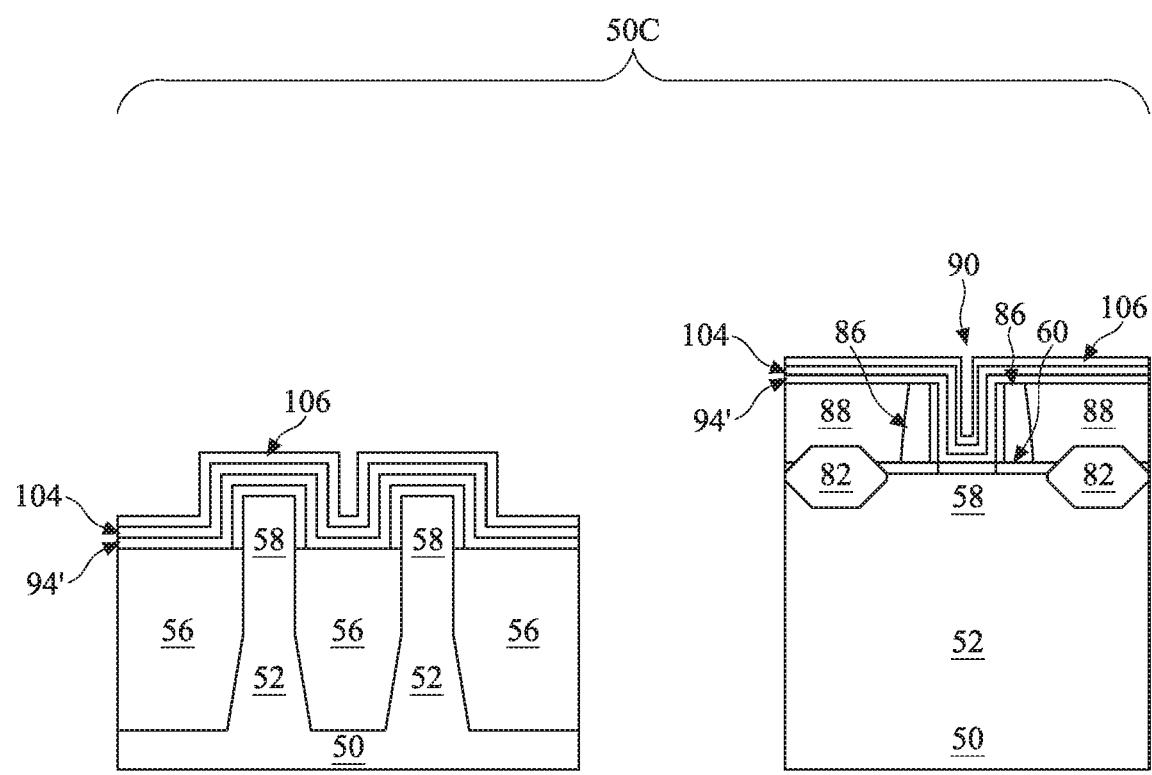

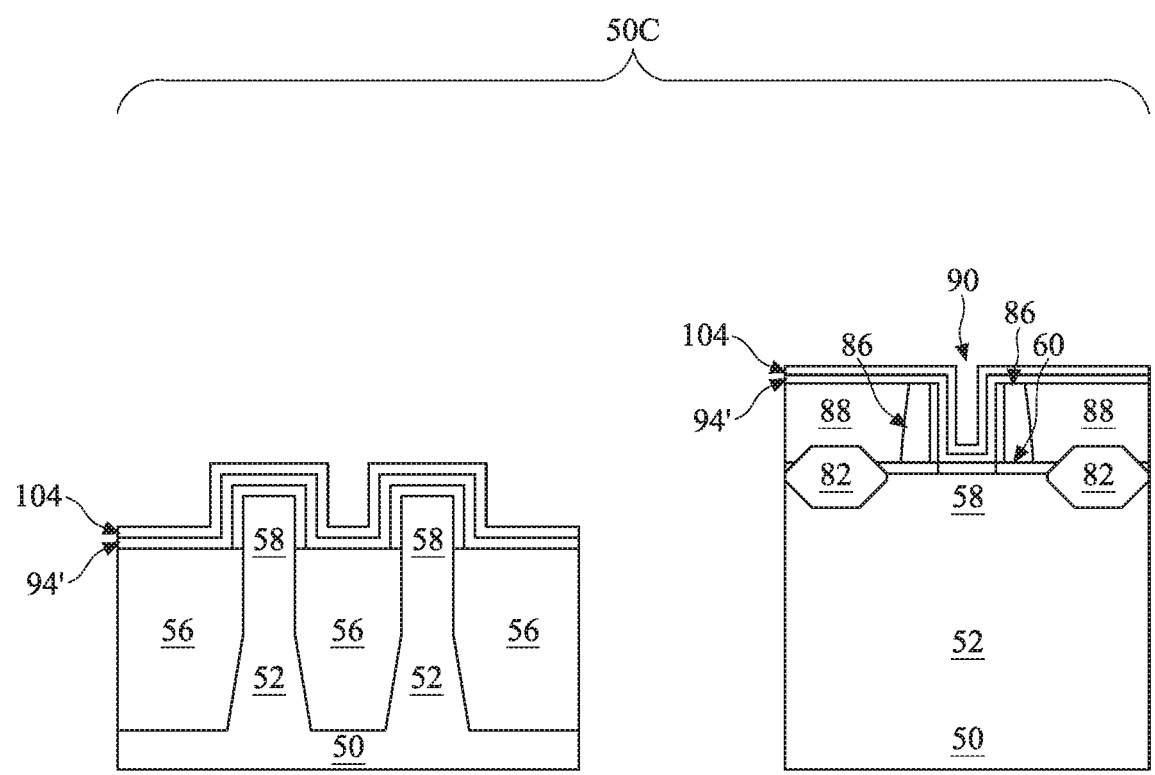

US 10,867,799 B2

FINFET DEVICE AND METHODS OF FORMING SAME

PRIORITY CLAIM AND CROSS-REFERENCE

This application is a divisional of U.S. patent application Ser. No. 15/964,253, filed on Apr. 27, 2018, entitled, FinFET Device and Methods of Forming Same," which claims priority to U.S. Provisional Application No. 62/552,886, filed on Aug. 31, 2017, entitled, "FinFET Device and Methods of Forming Same," which applications are incorporated herein by reference in their entireties.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 24A, 24B, 24C, and 24D are cross-sectional views of intermediate stages in the manufacturing of FinFETs in accordance with some embodiments.

FIGS. 25A, 25B, 25C, and 25D are cross-sectional views of intermediate stages in the manufacturing of FinFETs in accordance with some embodiments.

FIGS. 27A, 27B, 27C, and 27D are cross-sectional views of intermediate stages in the manufacturing of FinFETs in accordance with some embodiments.

FIGS. 28A, 28B, 28C, and 28D are cross-sectional views of intermediate stages in the manufacturing of FinFETs in accordance with some embodiments.

DETAILED DESCRIPTION

Figure 1:
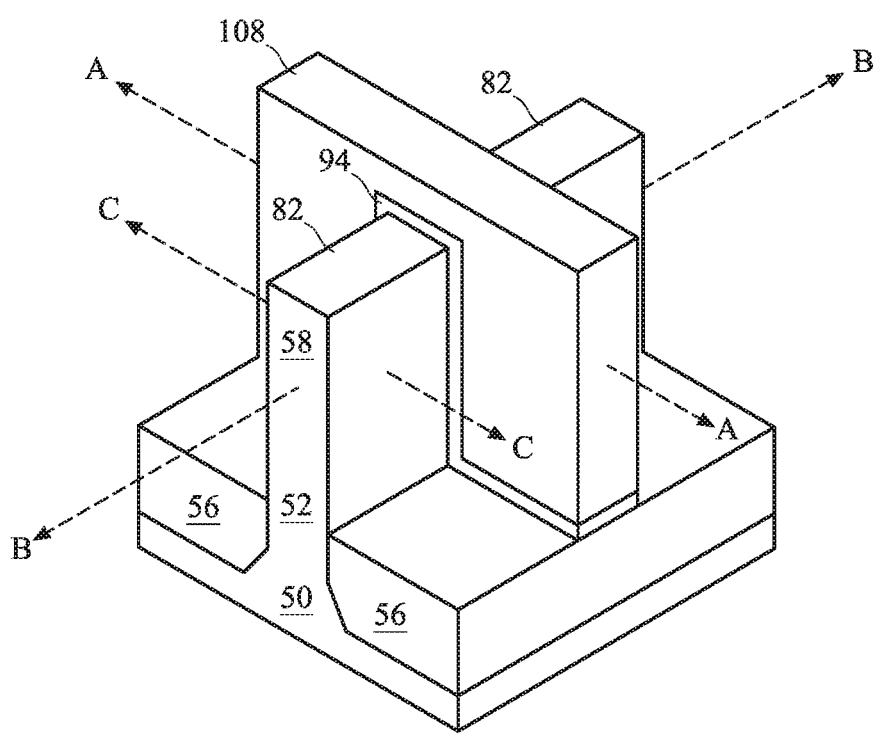
FIG. 1 illustrates an example of a fin field effect transistor (FinFET) in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistors (FinFETs) is used as an example to explain the concepts of the present disclosure. Planar transistors may also adopt the concept of the present disclosure.

FIG. 1 illustrates an example of a FinFET in a three-dimensional view, in accordance with some embodiments. The FinFET comprises a fin 58 on a substrate 50. Isolation regions 56 are over substrate 50, and the fin 58 protrudes above and from between neighboring isolation regions 56. A gate dielectric layer 94 is along sidewalls and over a top surface of the fin 58. A gate electrode 108 is over the gate dielectric 94. Source/drain regions 82 are disposed in opposite sides of the fin 58 with respect to the gate dielectric layer 94. FIG. 1 further illustrates reference cross-sections that are used in later figures. Cross-section A-A is across a channel, gate dielectric layer 94, and gate electrode 108 of the FinFET. Cross-section B-B is perpendicular to cross-section A-A and is along a longitudinal axis of the fin 58 and in a direction of, for example, a current flow between the source/drain regions 82. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 32A-D are cross-sectional views of intermediate stages in the manufacturing of FinFETs in accordance with some embodiments. FIGS. 2 through 7 illustrate reference cross-section A-A illustrated in FIG. 1, except for multiple fins/FinFETs. In FIGS. 8A through 14B, and 16A through 18B, figures ending with an "A" designation are illustrated along reference cross-section A-A illustrated in FIG. 1, and figures ending with a "B" designation are illustrated along a similar cross-section B-B illustrated in FIG. 1, except for multiple fins/FinFETs. FIGS. 10C and 10D are illustrated along reference cross-section C-C illustrated in FIG. 1, except for multiple fins/FinFETs. FIGS. 15, 26, 29, and 30 depict multiple FinFETs along cross section A-A of FIG. 1, where the FinFETs are respectively formed at edges of a wafer 91 (discussed below). In FIGS. 19A through 25D, FIGS. 27A through 28D, and FIGS. 31A through 32D, Figures ending with an "A" designation or a "C" designation are illustrated along reference cross-section A-A illustrated in FIG. 1, and figures ending with a "B" designation or a "D" designation are illustrated along a similar cross-section B-B illustrated in FIG. 1, except for multiple fins/FinFETs.

Figure 2:
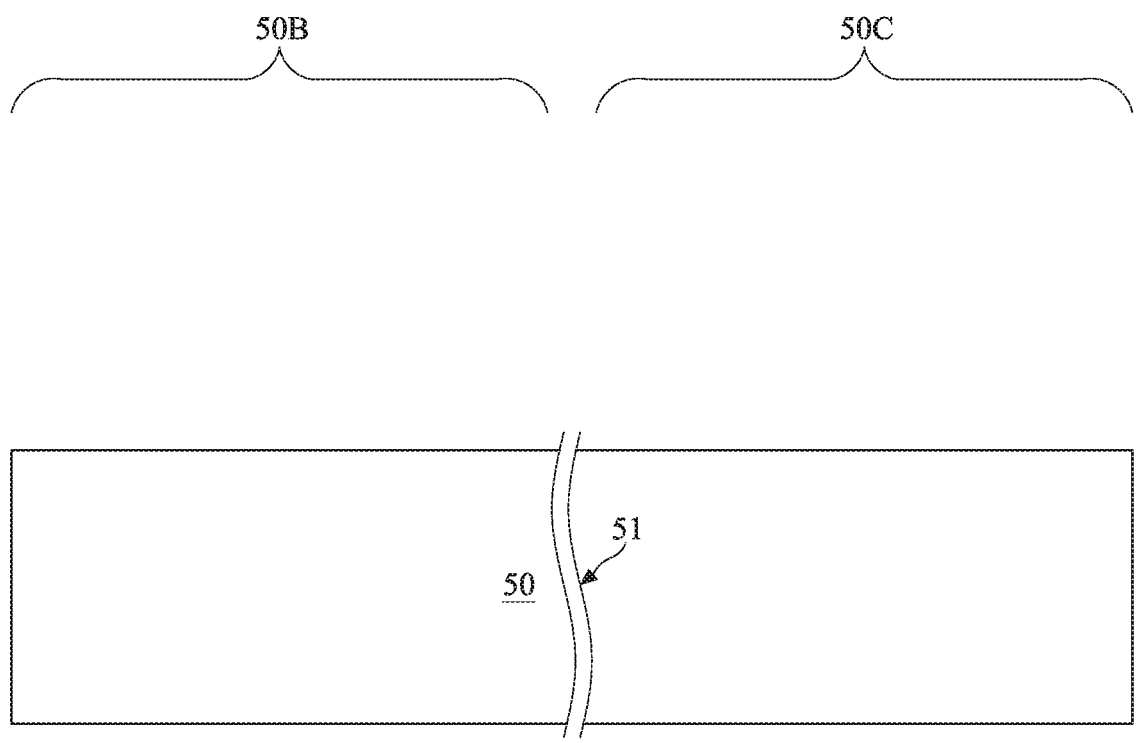
FIGS. 2 through 7 are cross-sectional views of intermediate stages in the manufacturing of FinFETs in accordance with some embodiments.

In FIG. 2, a substrate 50 is provided to form the wafers. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50B and a region 50C. The region 50B can be for forming n-type devices, such as NMOS transistors, e.g., n-type FinFETs. The region 50C can be for forming p-type devices, such as PMOS transistors, e.g., p-type FinFETs. The region 50B may be physically separated from the region 50C (as illustrated by divider 51), and any number of device features (e.g., other active devices, doped regions, isolation structures, etc.) may be disposed between the region 50B and the region 50C.

Figure 3:
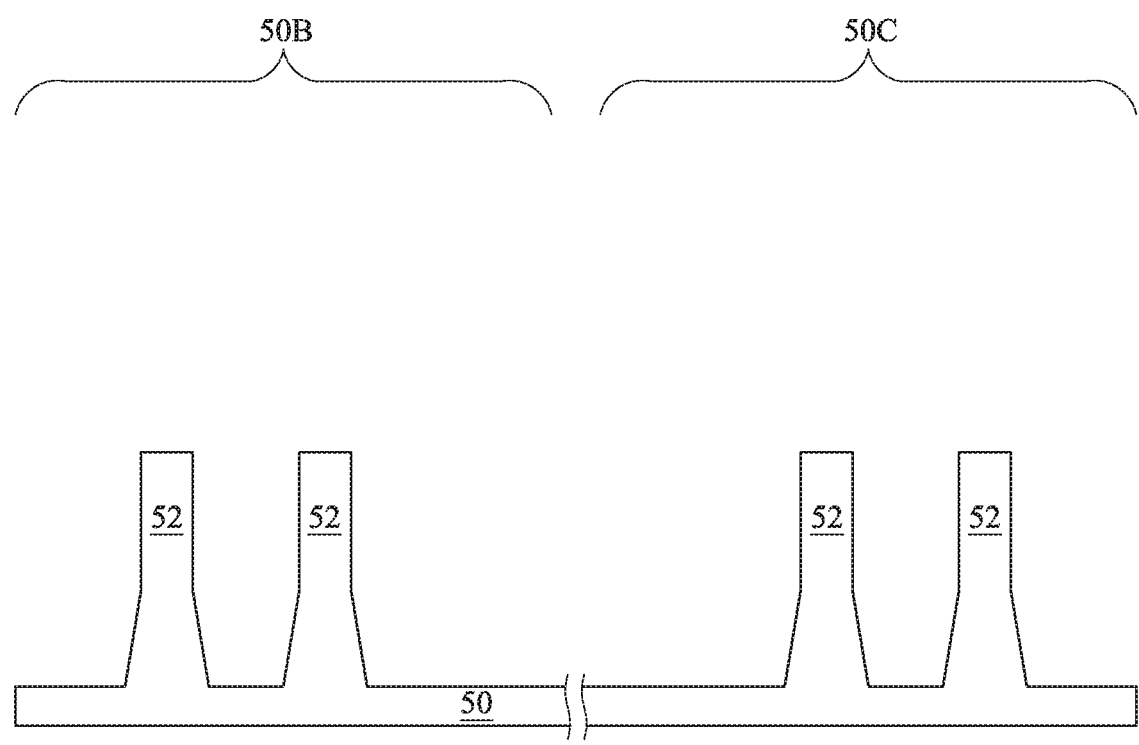

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 4:
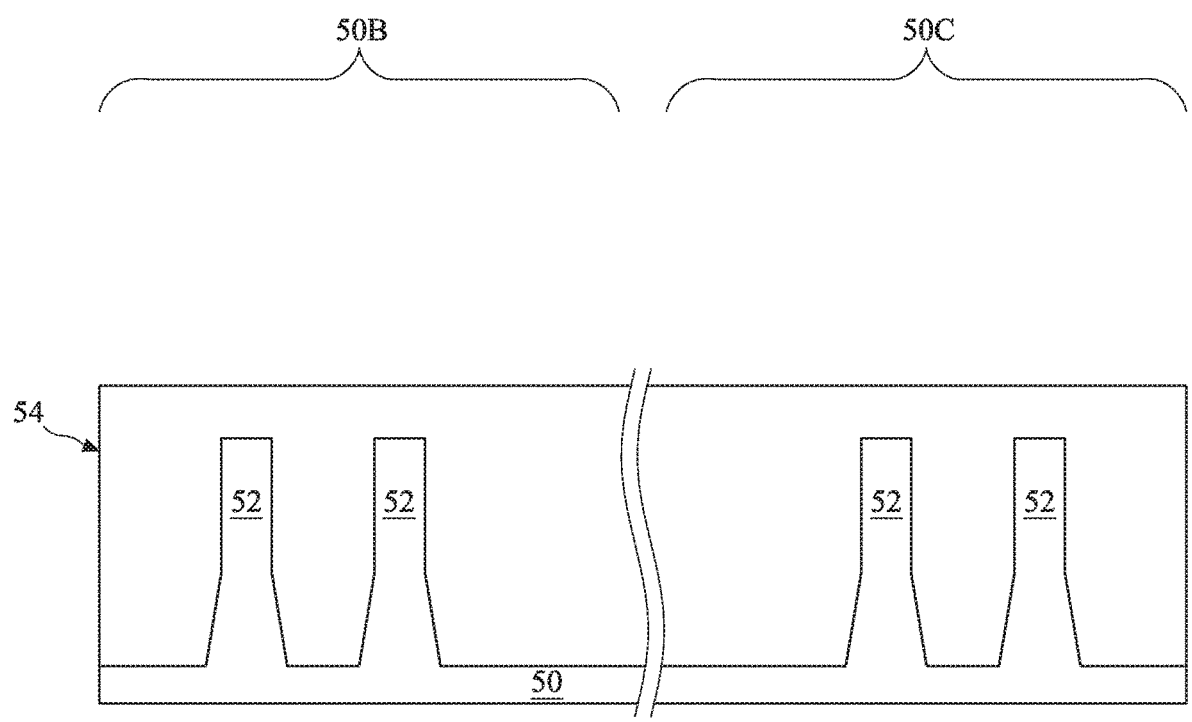

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52.

Figure 5:
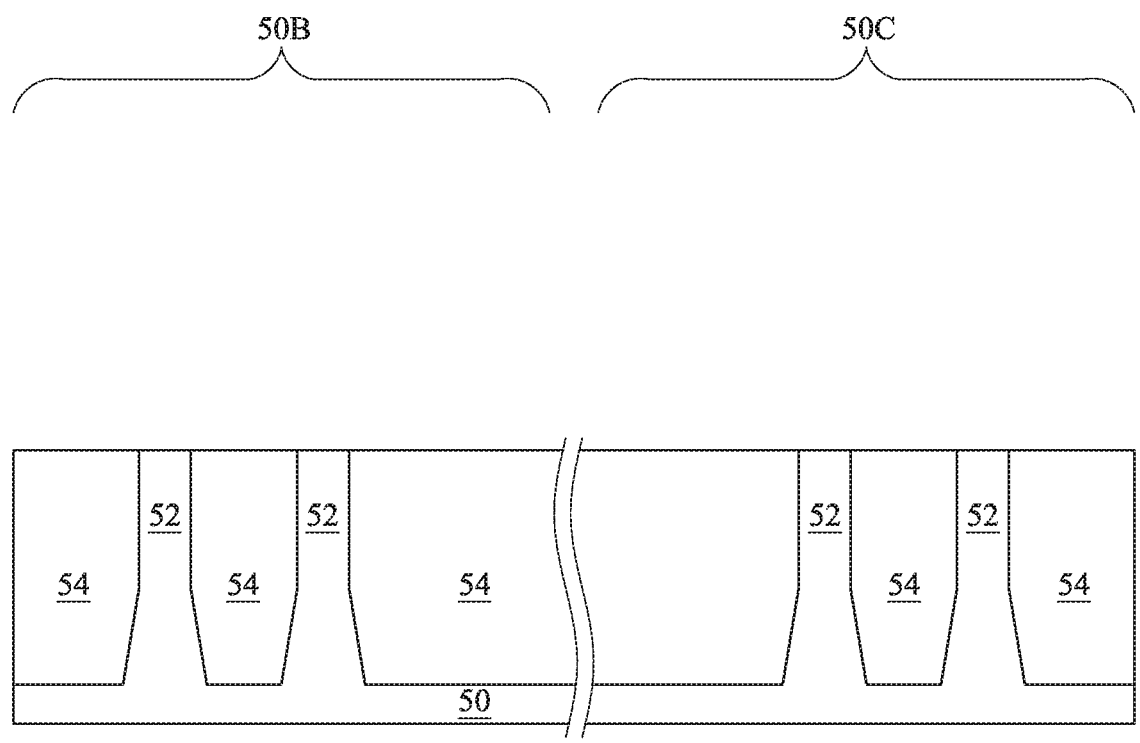

In FIG. 5, a planarization process is applied to the insulation material 54. In some embodiments, the planarization process includes a chemical mechanical polish (CMP), an etch back process, combinations thereof, or the like. The planarization process exposes the fins 52. Top surfaces of the fins 52 and the insulation material 54 are level after the planarization process is complete.

Figure 6:
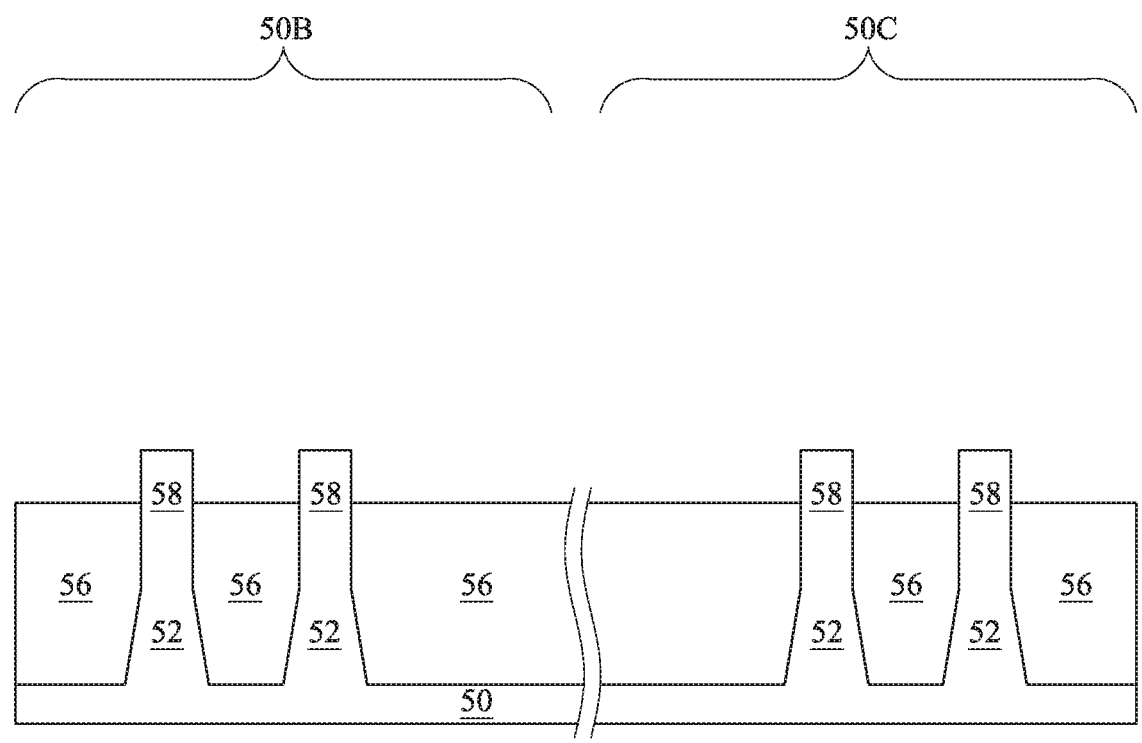

In FIG. 6, the insulation material 54 is recessed to form Shallow Trench Isolation (STI) regions 56. The insulation material 54 is recessed such that fins 58 in the region 50B and in the region 50C protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54. For example, a chemical oxide removal using a CERTAS® etch or an Applied Materials SICONI tool or dilute hydrofluoric (dHF) acid may be used.

A person having ordinary skill in the art will readily understand that the process described with respect to FIGS. 2 through 6 is just one example of how the fins 58 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 5 can be recessed, and a material different from the fins 52 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 58. In some embodiments where homoepitaxial or heteroepitaxial structures are epitaxially grown, the grown materials may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fins 58 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 58, the fins 52, and/or the substrate 50. In some embodiments, a P well may be formed in the region 50B, and an N well may be formed in the region 50C. In some embodiments, a P well or an N well are formed in both the region 50B and the region 50C.

In the embodiments with different well types, the different implant steps for the region 50B and the region 50C may be achieved using a photoresist or other masks (not shown). For example, a photoresist may be formed over the fins 58 and the STI regions 56 in the region 50B. The photoresist is patterned to expose the region 50C of the substrate 50, such as a PMOS region. The photoresist can be formed by using a spin-on technique and can be patterned using acceptable photolithography techniques. Once the photoresist is patterned, an n-type impurity implant is performed in the region 50C, and the photoresist may act as a mask to substantially prevent n-type impurities from being implanted into the region 50B, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50C, a photoresist is formed over the fins 58 and the STI regions 56 in the region 50C. The photoresist is patterned to expose the region 50B of the substrate 50, such as the NMOS region. The photoresist can be formed by using a spin-on technique and can be patterned using acceptable photolithography techniques. Once the photoresist is patterned, a p-type impurity implant may be performed in the region 50B, and the photoresist may act as a mask to substantially prevent p-type impurities from being implanted into the region 50C, such as the PMOS region. The p-type impurities may be boron, BF2, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50B and the region 50C, an anneal process may be performed to activate the p-type and/or n-type impurities that were implanted. In some embodiments, the grown materials of epitaxial fins may be in situ doped during growth, which may obviate the implantations, although in situ and implantation doping may be used together.

Figure 7:
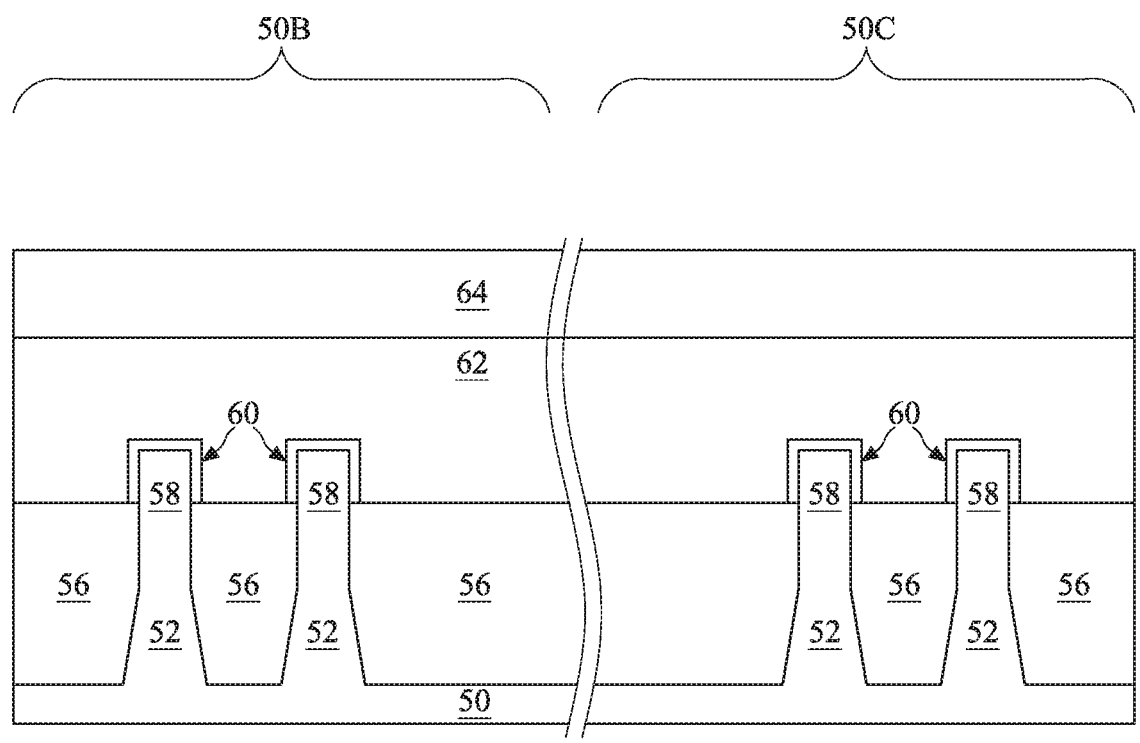

In FIG. 7, a dummy dielectric layer 60 is formed on the fins 58. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50B and the region 50C. In some embodiments, separate dummy gate layers may be formed in the region 50B and the region 50C, and separate mask layers may be formed in the region 50B and the region 50C.

FIGS. 8A through 18B illustrate various additional steps in the manufacturing of embodiment devices. FIGS. 8A through 18B illustrate features in either of the region 50B and the region 50C. For example, the structures illustrated in FIGS. 8A through 18B may be applicable to both the region 50B and the region 50C. Differences (if any) in the structures of the region 50B and the region 50C are described in the text accompanying each figure.

Figure 8A:
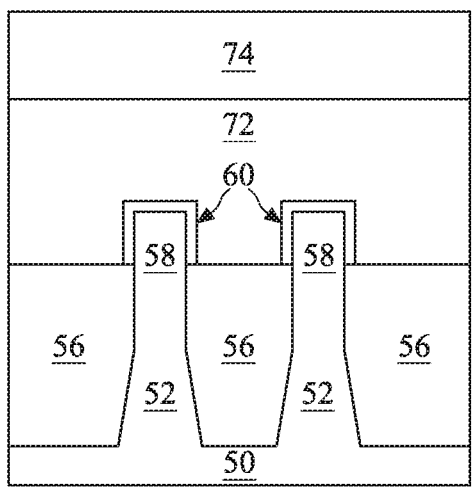
FIGS. 8A and 8B are cross-sectional views of intermediate stages in the manufacturing of FinFETs in accordance with some embodiments.
Figure 8B:
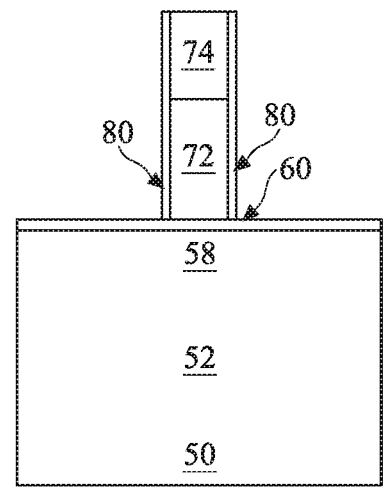

In FIGS. 8A and 8B, the mask layer 64 may be patterned using acceptable photolithography and etching techniques to form masks 74. The pattern of the masks 74 then may be transferred to the dummy gate layer 62 and the dummy dielectric layer 60 by an acceptable etching technique to form dummy gates 72. The dummy gates 72 cover respective channel regions of the fins 58. The pattern of the masks 74 may be used to physically separate each of the dummy gates 72 from adjacent dummy gates. The dummy gates 72 may also have a lengthwise direction substantially perpendicular to the lengthwise direction of respective epitaxial fins.

Further in FIGS. 8A and 8B, gate seal spacers 80 can be formed on exposed surfaces of the dummy gates 72, the masks 74, and/or the fins 58. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50B, while exposing the region 50C, and appropriate type (e.g., n-type or p-type) impurities may be implanted into the exposed fins 58 in the region 50C. The mask may then be removed. Subsequently, a mask, such as a photoresist, may be formed over the region 50C while exposing the region 50B, and appropriate type impurities may be implanted into the exposed fins 58 in the region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 9A:
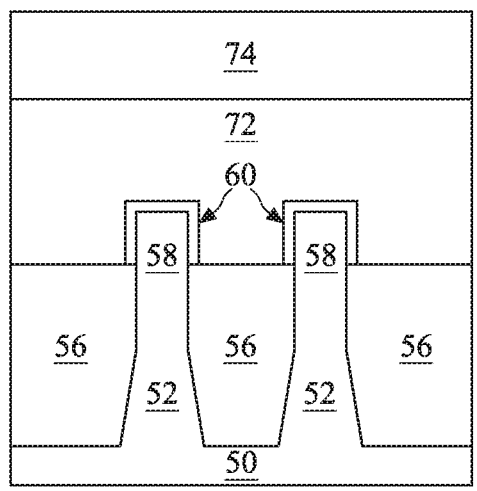
FIGS. 9A and 9B are cross-sectional views of intermediate stages in the manufacturing of FinFETs in accordance with some embodiments.
Figure 9B:
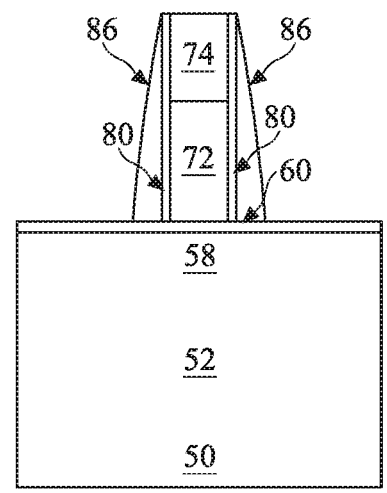

In FIGS. 9A and 9B, gate spacers 86 are formed on the gate seal spacers 80 along sidewalls of the dummy gates 72 and the masks 74. The gate spacers 86 may be formed by conformally depositing a material and subsequently anisotropically etching the material. The material of the gate spacers 86 may be silicon nitride, SiCN, a combination thereof, or the like.

Figure 10A:
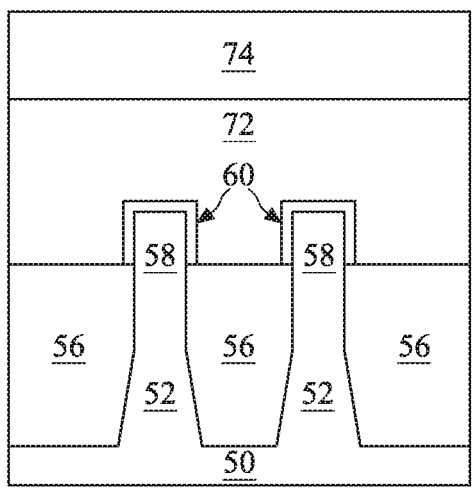
FIGS. 10A, 10B, 10C, and 10D are cross-sectional views of intermediate stages in the manufacturing of FinFETs in accordance with some embodiments.
Figure 10B:
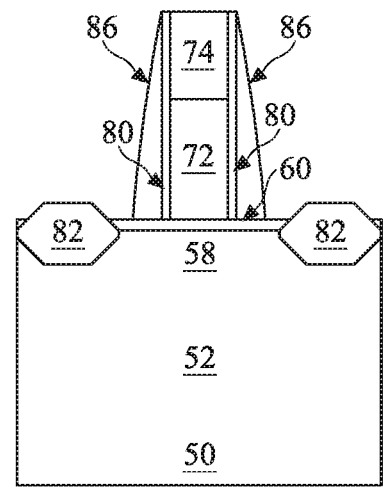
Figure 10C:
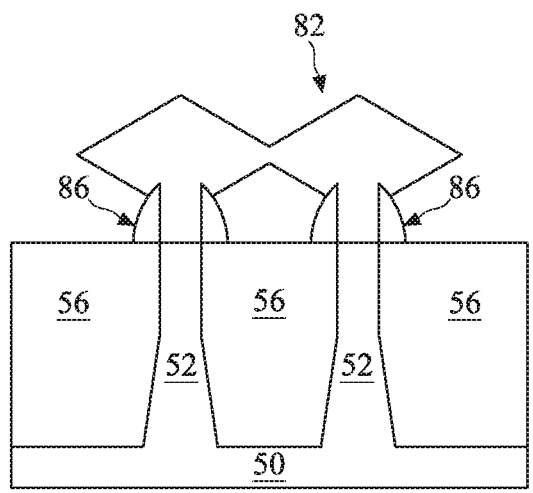
Figure 10D:
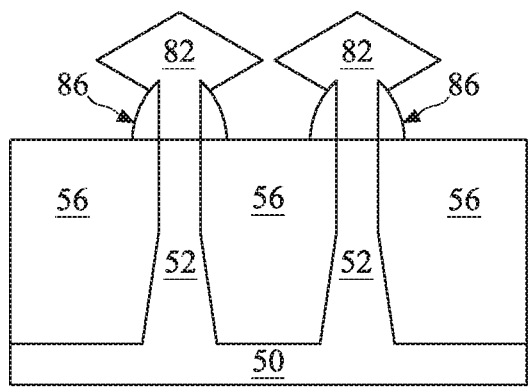

In FIGS. 10A and 10B epitaxial source/drain regions 82 are formed in the fins 58. The epitaxial source/drain regions 82 are formed in the fins 58 such that each dummy gate 72 is disposed between respective neighboring pairs of the epitaxial source/drain regions 82. In some embodiments epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50B, e.g., the NMOS region, may be formed by masking the region 50C, e.g., the PMOS region, and etching source/drain regions of the fins 58 in the region 50B form recesses in the fins 58. Then, the epitaxial source/drain regions 82 in the region 50B are epitaxially grown in the recesses. The epitaxial source/drain regions 82 may include any acceptable material, such as appropriate for n-type FinFETs. For example, if the fin 58 is silicon, the epitaxial source/drain regions 82 in the region 50B may include silicon, SiC, SiCP, SiP, or the like. The epitaxial source/drain regions 82 in the region 50B may have surfaces raised from respective surfaces of the fins 58 and may have facets.

The epitaxial source/drain regions 82 in the region 50C, e.g., the PMOS region, may be formed by masking the region 50B, e.g., the NMOS region, and etching source/drain regions of the fins 58 in the region 50C are etched to form recesses in the fins 58. Then, the epitaxial source/drain regions 82 in the region 50C are epitaxially grown in the recesses. The epitaxial source/drain regions 82 may include any acceptable material, such as appropriate for p-type FinFETs. For example, if the fin 58 is silicon, the epitaxial source/drain regions 82 in the region 50C may comprise SiGe, SiGeB, Ge, GeSn, or the like. The epitaxial source/drain regions 82 in the region 50C may also have surfaces raised from respective surfaces of the fins 58 and may have facets.

The epitaxial source/drain regions 82 and/or the fins 58 may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50B and the region 50C, upper surfaces of the epitaxial source/drain regions have facets which expand laterally outward beyond a sidewalls of the fins 58. In some embodiments, these facets cause adjacent source/drain regions 82 of a same FinFET to merge as illustrated by FIG. 10C. In other embodiments, adjacent source/drain regions 82 remain separated after the epitaxy process is completed as illustrated by FIG. 10D.

Figure 11A:
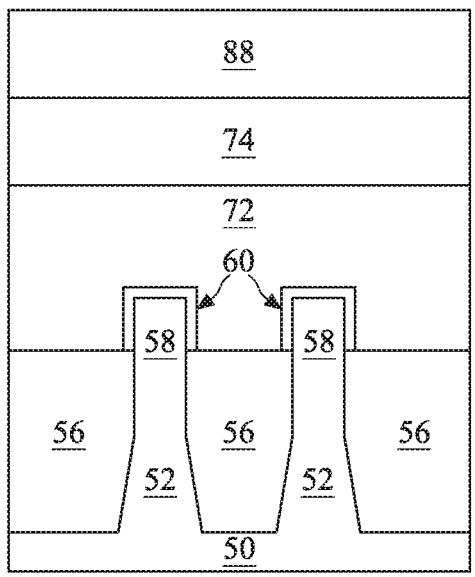
FIGS. 11A and 11B are cross-sectional views of intermediate stages in the manufacturing of FinFETs in accordance with some embodiments.
Figure 11B:
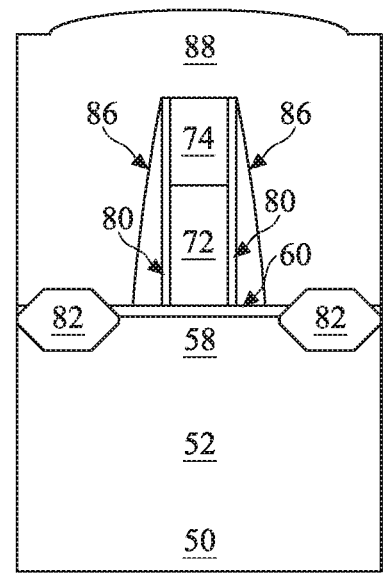

In FIGS. 11A and 11B, an interlayer dielectric (ILD) 88 is deposited over the structure illustrated in FIGS. 10A and 10B. The ILD 88 may be formed of a dielectric material or a semiconductor material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Semiconductor materials may include amorphous silicon, silicon germanium (Si$_x$Ge$_{1-x}$, where x can be between approximately 0 and 1), pure Germanium, or the like. Other insulation or semiconductor materials formed by any acceptable process may be used. In some embodiments, a contact etch stop layer (CESL), not illustrated, is disposed between the ILD 88 and the epitaxial source/drain regions 82, the hard mask 74, and the gate spacers 86.

Figure 12A:
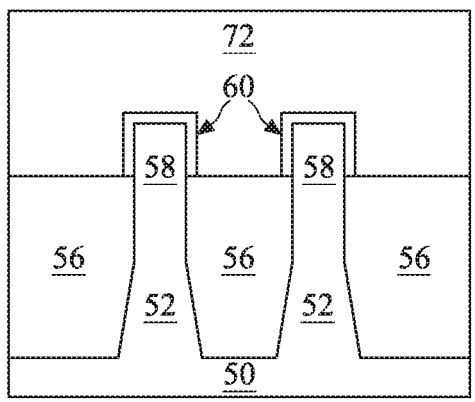
FIGS. 12A and 12B are cross-sectional views of intermediate stages in the manufacturing of FinFETs in accordance with some embodiments.
Figure 12B:
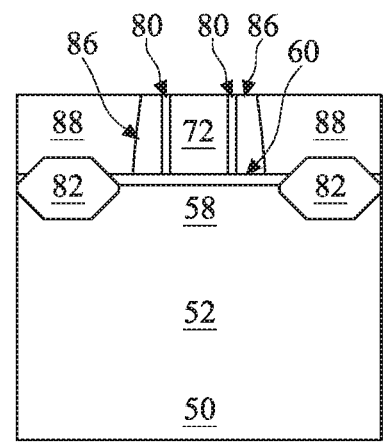

In FIGS. 12A and 12B, a planarization process, such as a CMP, may be performed to level the top surface of the ILD 88 with the top surfaces of the dummy gates 72. In an embodiment, the planarization process is performed using a planarization system. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the ILD 88 are level. Accordingly, the top surfaces of the dummy gates 72 are exposed through the ILD 88.

Figure 13A:
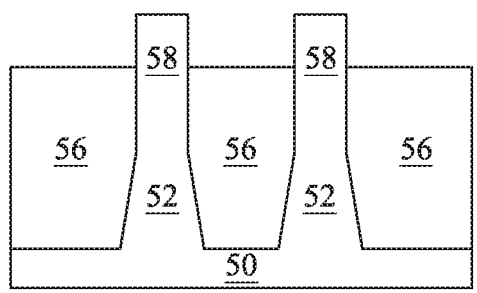
FIGS. 13A and 13B are cross-sectional views of intermediate stages in the manufacturing of FinFETs in accordance with some embodiments.
Figure 13B:
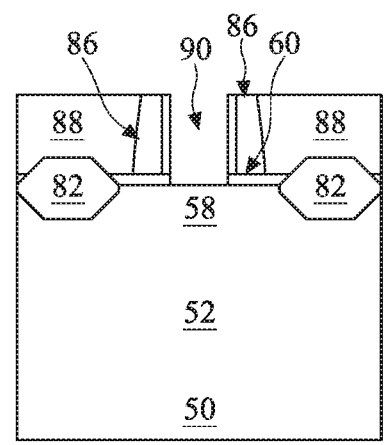

In FIGS. 13A and 13B, the dummy gates 72 and portions of the dummy dielectric layer 60 directly underlying the exposed dummy gates 72 are removed in an etching step(s), so that recesses 90 are formed. In some embodiments, the dummy gates 72 are removed by an anisotropic dry etch process. For example, the etching process may include a dry etch process using reaction gas(es) that selectively etch the dummy gates 72 without etching the ILD 88 or the gate spacers 86. Each recess 90 exposes a channel region of a respective fin 58. Each channel region is disposed between neighboring pairs of the epitaxial source/drain regions 82.

During the removal, the dummy dielectric layer 60 may be used as an etch stop layer when the dummy gates 72 are etched. The dummy dielectric layer 60 may then be removed after the removal of the dummy gates 72.

Figure 14A:
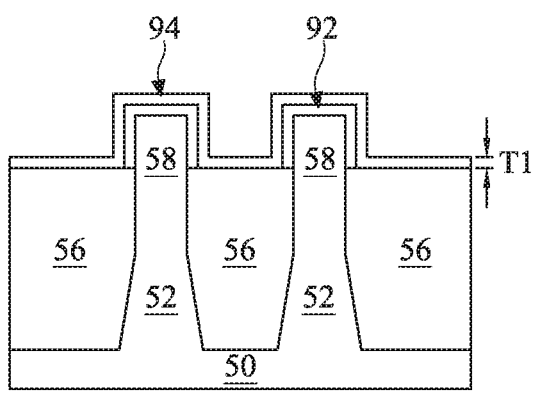
FIGS. 14A and 14B are cross-sectional views of intermediate stages in the manufacturing of FinFETs in accordance with some embodiments.
Figure 14B:
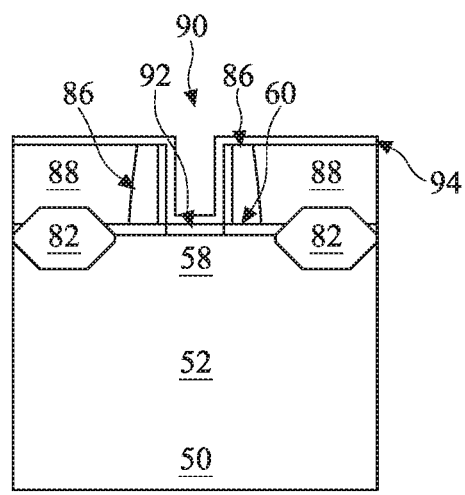

Next, referring to FIGS. 14A and 14B, an interfacial layer (IL) 92 is formed on the exposed surfaces of protruding fins 58. The IL 92 may include an oxide layer, such as a silicon oxide layer, which is formed through the thermal oxidation of the exposed surface layers of protruding fins 58, a chemical oxidation process, or a deposition process. Although FIG. 14A depicts the IL 92 being formed only on the fin 58 and not extending over the STI regions 56, in some embodiments the IL 92 may be formed extending over, and/or substantially covering, the STI regions 56.

FIGS. 14A and 14B also depict the formation of a gate dielectric layer 94. The gate dielectric layer 94 is deposited conformally in the recess 90, such as on the top surfaces and the sidewalls of the IL 92 and on sidewalls of the gate seal spacers 80/gate spacers 86. The gate dielectric layer 94 may also be formed on top surface of the ILD 88. In accordance with some embodiments, the gate dielectric layer 94 comprises silicon oxide, silicon nitride, or multilayers thereof. In some embodiments, the gate dielectric layer 94 is a high-k dielectric material, and in these embodiments, the gate dielectric layer 94 may have a k value greater than about 7.0, and may include a metal oxide or a silicate of Hf, Al, Zr, La, Mg, Ba, Ti, Pb, and combinations thereof. The formation methods of the gate dielectric layer 94 may include Molecular-Beam Deposition (MBD), ALD, PECVD, and the like. The gate dielectric layer 94 may have a thickness T1 of about 1 nm to about 20 nm in accordance with some embodiments.

The formation of the gate dielectric layers 94 in the region 50B and the region 50C may occur simultaneously such that the gate dielectric layers 94 in each region are formed from the same materials. In some embodiments, the gate dielectric layers 94 in each region may be formed by distinct processes, such that the gate dielectric layers 94 may be different materials. Various masking steps may be used to mask and expose appropriate regions when using distinct processes.

Figure 15:
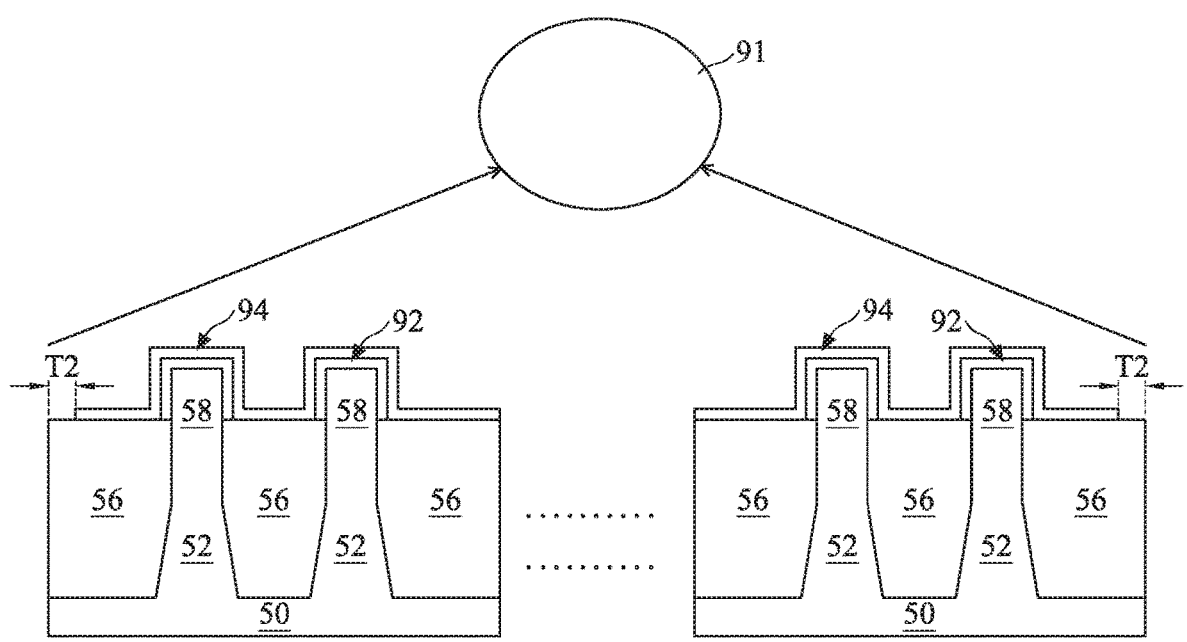
FIG. 15 illustrates cross-sectional views of intermediate stages in the manufacturing of FinFETs in accordance with some embodiments.

FIG. 15 depicts multiple FinFETs that are respectively being formed along an edge of wafer 91 (wafer 91 is shown in plan view in FIG. 15 while the multiple FinFETs are shown in a cross-sectional view). As shown in FIG. 15, the gate dielectric layer 94 may be formed in a manner that it is thinner at edges of the wafer 91 than in other sections of wafer 91. For example, gate dielectric layer 94 may be formed by a deposition process that results in the gate dielectric layer 94 being thinner at edges of the wafer 91 that in other sections of wafer 91. At the edges of wafer 91, gate dielectric layer 94 may not extend to the wafer edge, creating a bevel at the edges of wafer 91. Because of the bevel, an upper surface of an STI region 56 may be exposed along the wafer edge. If the IL 92 extends along the upper surface of insulation material 54, IL 92 may be exposed along the wafer edge. In some embodiments, gate dielectric layer 94 may be set back from an edge of wafer 91 a distance T2. In some embodiments, T2 is less than about 10 nm.

Figure 16A:
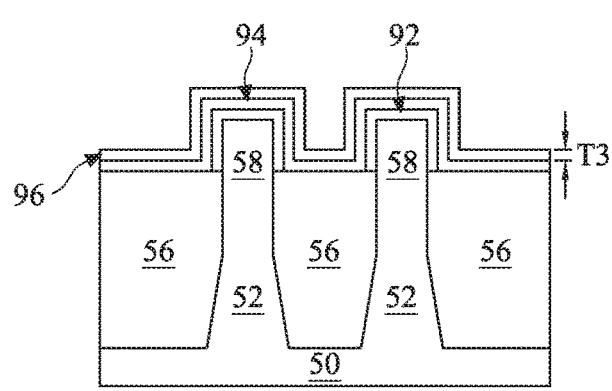
FIGS. 16A and 16B are cross-sectional views of intermediate stages in the manufacturing of FinFETs in accordance with some embodiments.
Figure 16B:
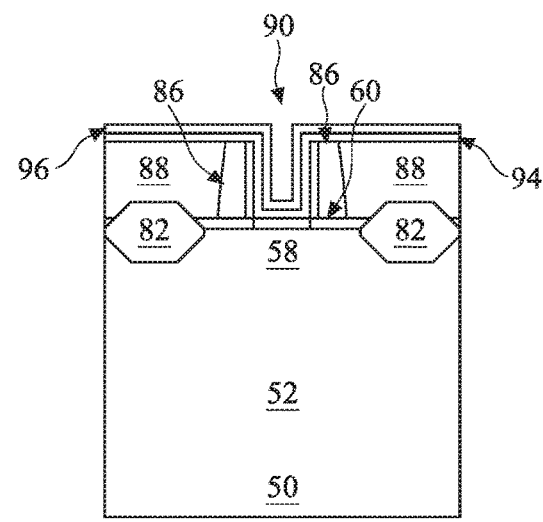

FIGS. 16A and 16B depict a cross sectional view of a FinFET device that is not being formed at a wafer edge. A metal oxide layer 96 is formed over the gate dielectric layer 94. As will be explained in greater detail below (see FIG. 23A-D), metal oxide layer 96, when undergoing an anneal process, may allow for the diffusion of ions from metal oxide layer 96 into the underlying gate dielectric layer 94. In accordance with some embodiments, metal oxide layer 96 comprises lanthanum oxide. Lanthanum oxide may be unstable at room temperatures, and some lanthanum oxide compounds may break, in which case lanthanum ions are present in the lanthanum oxide-containing metal oxide layer 96. In some embodiments, a precursor used to form the lanthanum oxide may not react completely, resulting in lanthanum ions being present in the lanthanum oxide-containing metal oxide layer 96. Some of these lanthanum ions may bond with fluorine elements or Cl elements that are present due to process chemicals that are used. When the lanthanum oxide-containing metal oxide layer 96 is annealed, lanthanum ions may diffuse from metal oxide layer 96 into gate dielectric layer 94. The diffusion of lanthanum ions from metal oxide layer 96 into gate dielectric layer 94 may create a gate dielectric layer 94' (shown in FIGS. 23C-D) that is doped with lanthanum. In some devices, such as PMOS devices, a lanthanum-doped gate dielectric layer 94' may allow for a device having improved electrical characteristics. For example, a PMOS device comprising lanthanum-doped gate dielectric layer 94' may have a voltage threshold that may be more closely matched to a voltage threshold of an NMOS device. Additionally, design requirements of certain devices may result in devices with smaller gate dimensions. A device comprising lanthanum-doped gate dielectric layer 94' may allow for a gate stack to be formed in the device with a better fill and smaller or reduced gaps in the gate stack.

The metal oxide layer 96 may be deposited conformally in the recess 90, such as on the top surfaces and the sidewalls of the gate dielectric layer 94. The metal oxide layer 96 may also extend along portions of the gate dielectric layer 94 that are disposed on the top surface of ILD 88. The formation methods of the metal oxide layer 96 may include Molecular-Beam Deposition (MBD), ALD, PECVD, and the like. The metal oxide layer may have a thickness T3 of about 3 Å to about 50 Å in accordance with some embodiments. As discussed above, metal oxide layer 96 may comprise lanthanum oxide. For example, metal oxide layer 96 may include LaO or $La_2O_3$ in accordance with some embodiments. Metal oxide layer 96 may be deposited using LaCl as a precursor in some embodiments.

FIGS. 17A through 20D depict the removal of metal oxide layer 96 from region 50B (i.e., the NMOS region). Although embodiments herein depict the removal of metal oxide layer 96 from region 50B, in other embodiments metal oxide layer 96 is not removed from region 50B and metal oxide layer 96 may remain in both region 50C and region 50B. In some embodiments metal oxide layer 96 may remain in region 50B and be removed from region 50C, or metal oxide layer 96 may be partially removed from both region 50C and region 50B. The pattern of metal oxide layer 96 may be selected based upon a desired voltage threshold of the FinFET in a particular design.

Figure 17A:
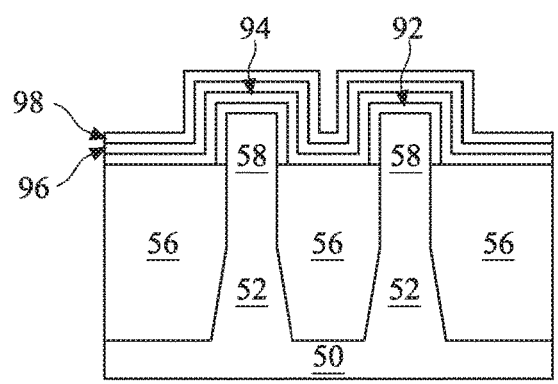
FIGS. 17A and 17B are cross-sectional views of intermediate stages in the manufacturing of FinFETs in accordance with some embodiments.
Figure 17B:
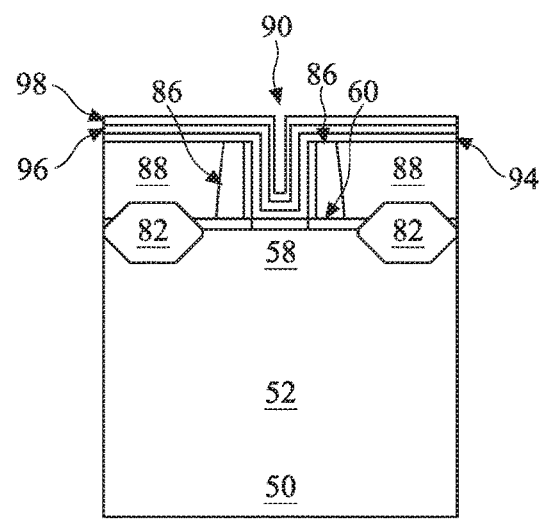

Referring to FIGS. 17A and 17B, a hard mask layer 98 is formed over the metal oxide layer 96. The hard mask layer 98 may be deposited conformally in the recess 90, such as on the top surfaces and the sidewalls of the metal oxide layer 96. Hard mask layer 98 may include any suitable material. In some embodiments, hard mask layer 98 may include titanium nitride. Hard mask layer 98 may be formed by deposition, such as CVD, ALD, or the like.

Figure 18A:
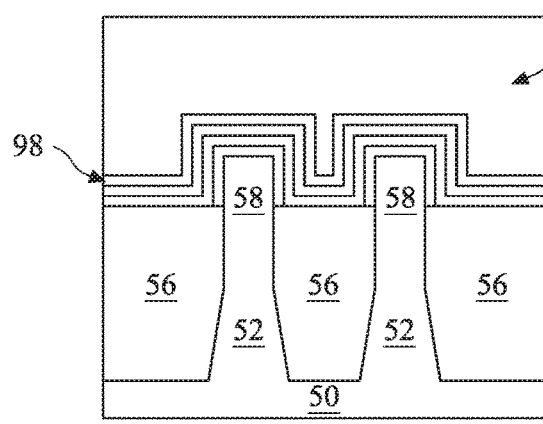
FIGS. 18A and 18B are cross-sectional views of intermediate stages in the manufacturing of FinFETs in accordance with some embodiments.
Figure 18B:
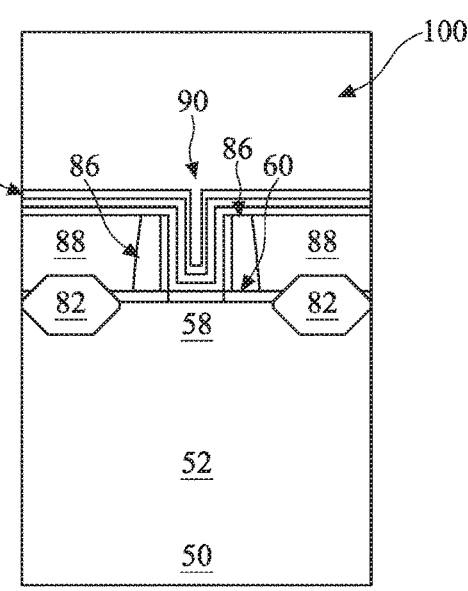

FIGS. 18A and 18B depict the formation of a photoresist mask 100 over hard mask layer 98. For example, photoresist mask 100 may be formed using a spin-on technique.

In FIGS. 19A-D through 25A-D, 27A-D to 28A-D, and 31A-D to 32A-D, different processing is depicted for region 50B (i.e. the NMOS region) and region 50C (i.e. the PMOS region). Figures ending with an "A" or "B" designation depict region 50B and figures ending with a "C" or "D" designation depict region 50C.

Figures 19A, 19B:
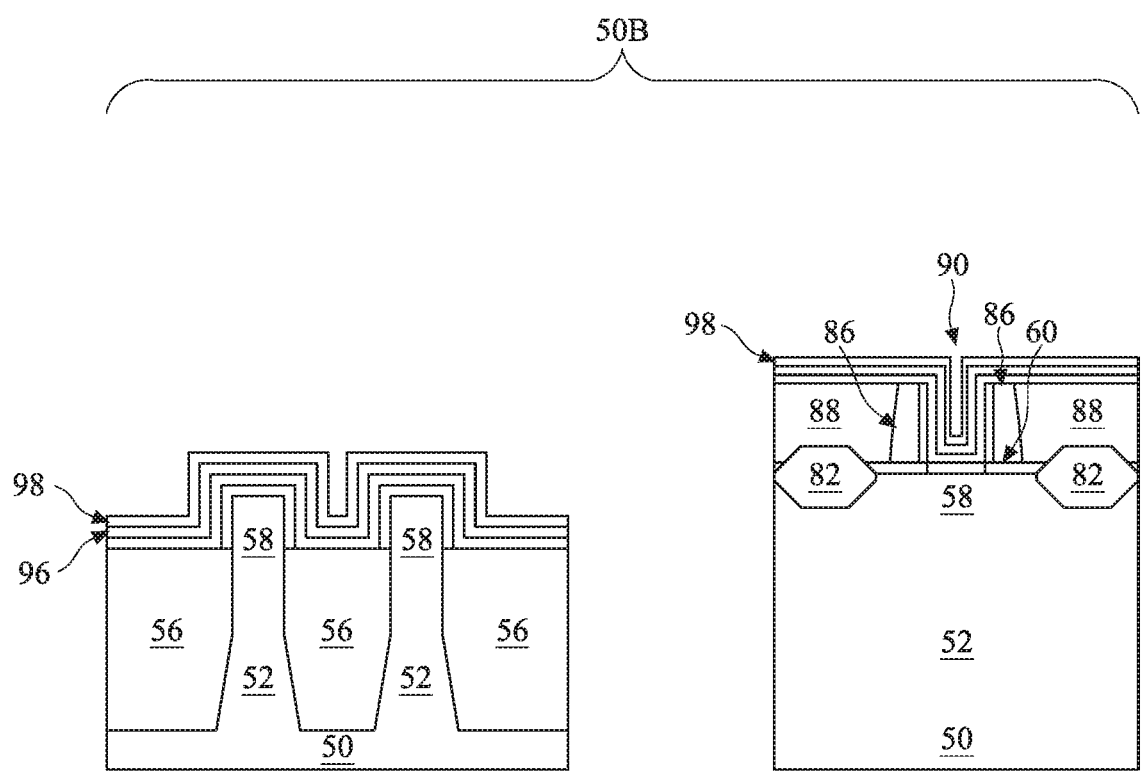
FIGS. 19A, 19B, 19C, and 19D are cross-sectional views of intermediate stages in the manufacturing of FinFETs in accordance with some embodiments.
Figure 19C:
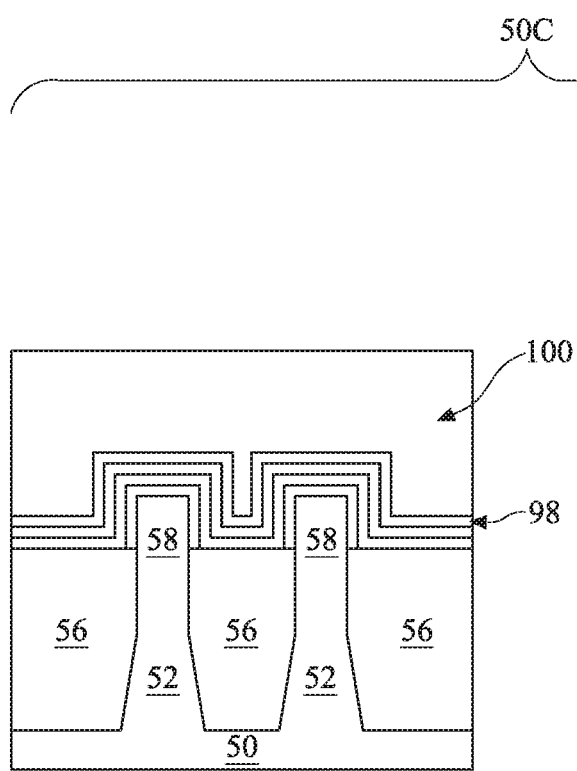
Figure 19D:
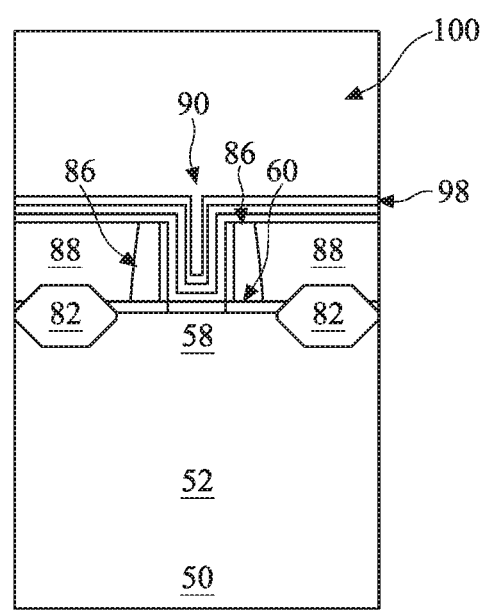

In FIGS. 19A through 19D, photoresist mask 100 is patterned to expose region 50B (i.e. the NMOS region) as shown in FIGS. 19A and 19B. The patterning of the photoresist mask 100 exposes the hard mask layer 98 in region 50B, as shown in FIGS. 19A and 19B. The photoresist mask 100 may be patterned using acceptable lithography techniques. The photoresist mask 100 remains in region 50C (i.e. the PMOS region), as shown in FIGS. 19C and 19D.

Figures 20A, 20B:
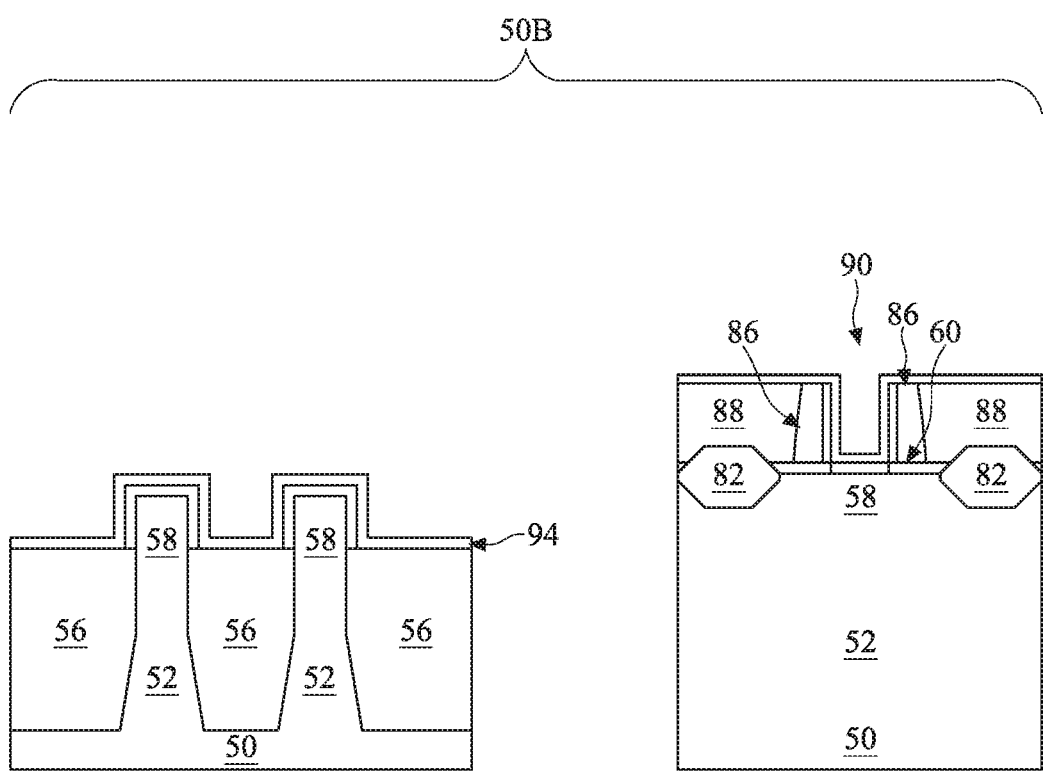
FIGS. 20A, 20B, 20C, and 20D are cross-sectional views of intermediate stages in the manufacturing of FinFETs in accordance with some embodiments.
Figure 20C:
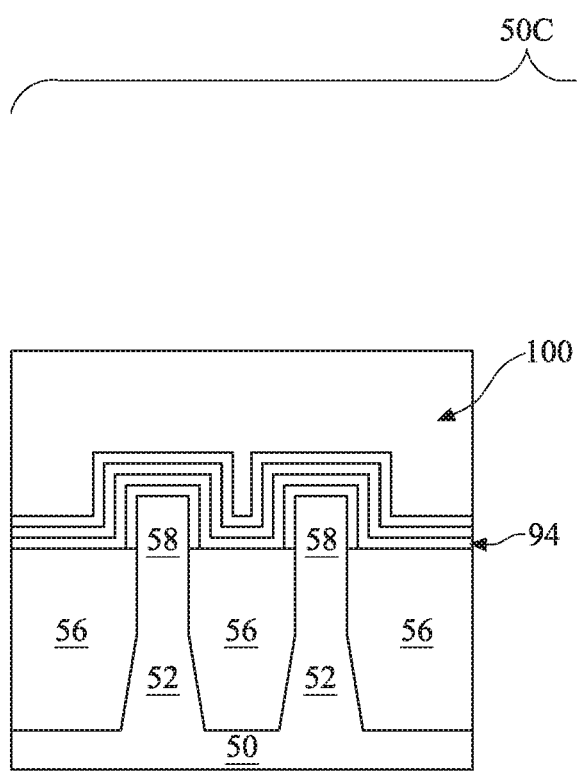
Figure 20D:
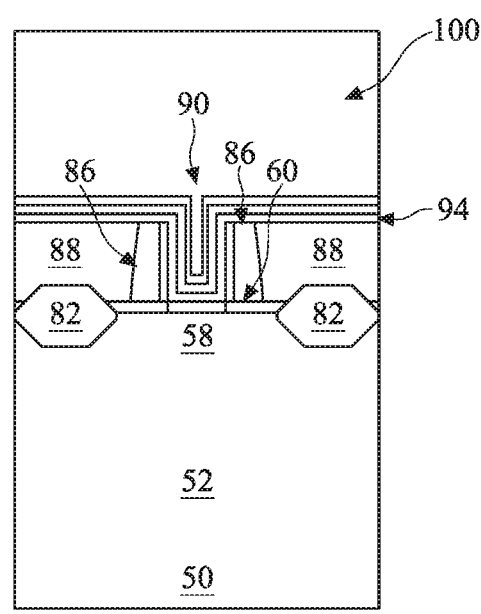
Figures 21A, 21B:
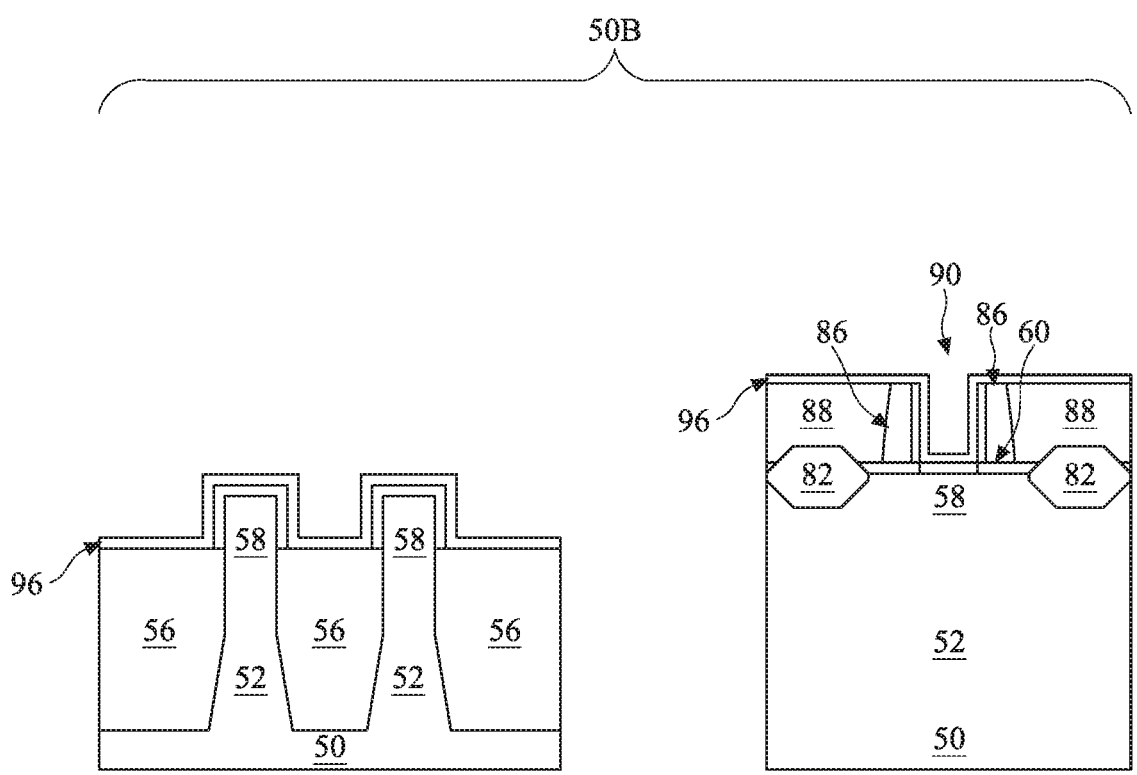
FIGS. 21A, 21B, 21C, and 21D are cross-sectional views of intermediate stages in the manufacturing of FinFETs in accordance with some embodiments.
Figures 21C, 21D:
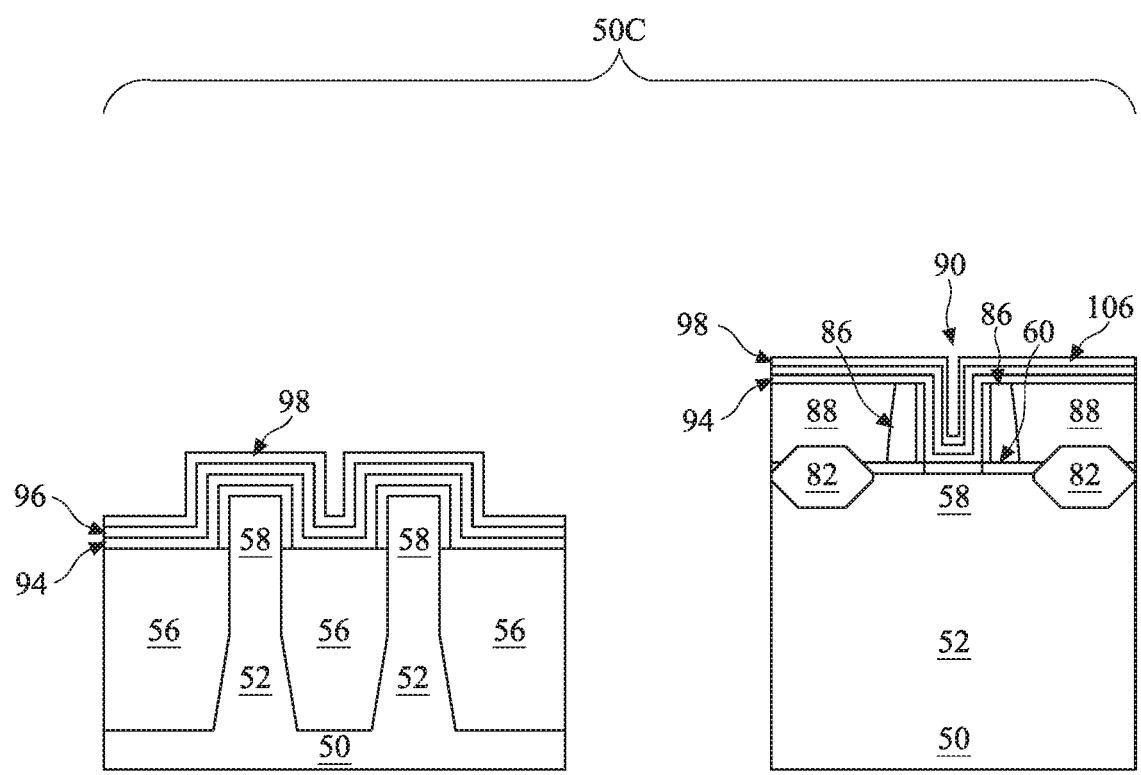

Next, an etching process is performed to remove the hard mask layer 98 in region 50B, and to remove the metal oxide layer 96 in region 50B. Any suitable etching process may be used, such as wet etching or dry etching. The etching may be anisotropic. The hard mask layer 98 and the metal oxide layer 96 may be etched in a single process, or multiple etching processes may be used. The etching of the hard mask layer 98 and the metal oxide layer 96 in region 50B exposes the gate dielectric layer 94 in region 50B as shown in FIGS. 20A and 20B. After the etching process, the photoresist mask 100 may remain in region 50C, as shown in FIGS. 20C and 20D. In some embodiments, the photoresist mask 100 in region 50C may be consumed or partially consumed during the etching process.

Referring to FIGS. 21A-D, the remaining photoresist mask 100 in region 50C is removed, for example using an ashing process. The removal of the remaining photoresist mask 100 in region 50C exposes the remaining hard mask layer 98 in region 50C.

Figures 22A, 22B:
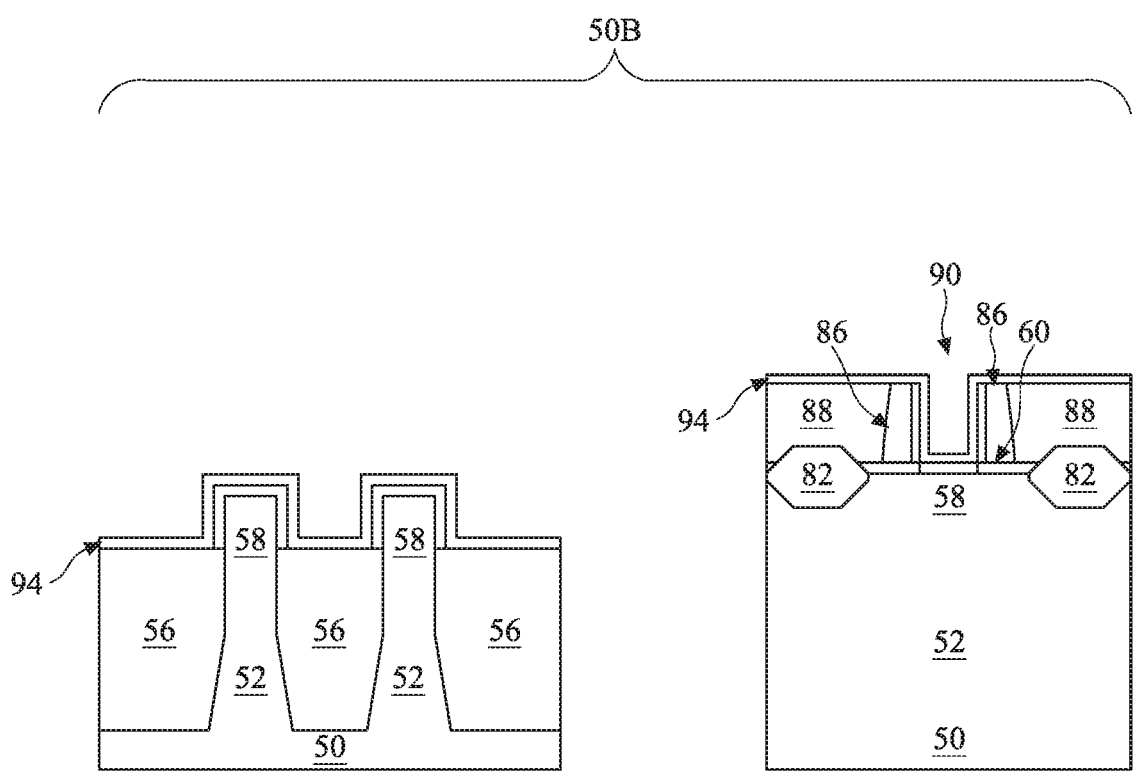
FIGS. 22A, 22B, 22C, and 22D are cross-sectional views of intermediate stages in the manufacturing of FinFETs in accordance with some embodiments.
Figures 22C, 22D:
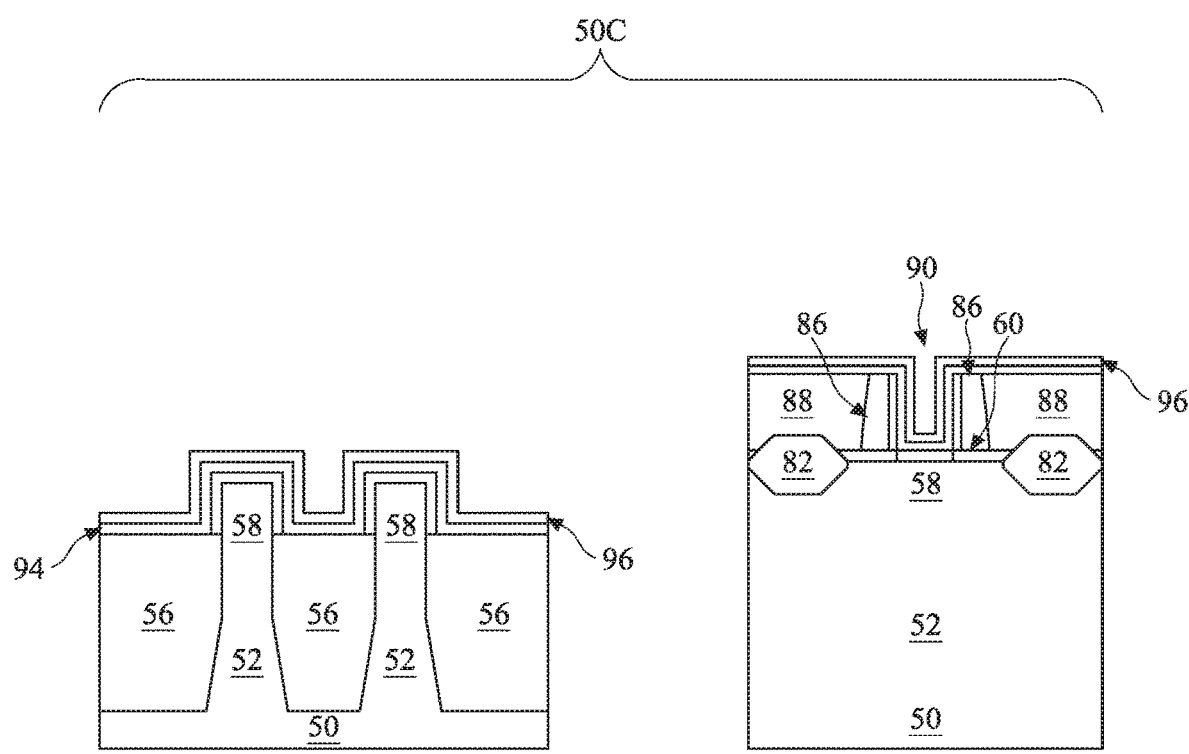

Next, as shown in FIGS. 22A-D, the remaining hard mask layer 98 in region 50C is removed, for example using a wet cleaning process. The removal of the remaining hard mask layer 98 in region 50C exposes metal oxide layer 96 in region 50C, as shown in FIGS. 22C-D.

Referring to FIGS. 23A-D, an anneal process 102 is performed. During the anneal process 102, the FinFET being formed is raised to an anneal temperature for a desired duration. In some embodiments, the anneal temperature may be about 300° C. to about 550° C., and the anneal process may have a duration of about 1 minute to about 3 minutes.

Figures 23A, 23B:
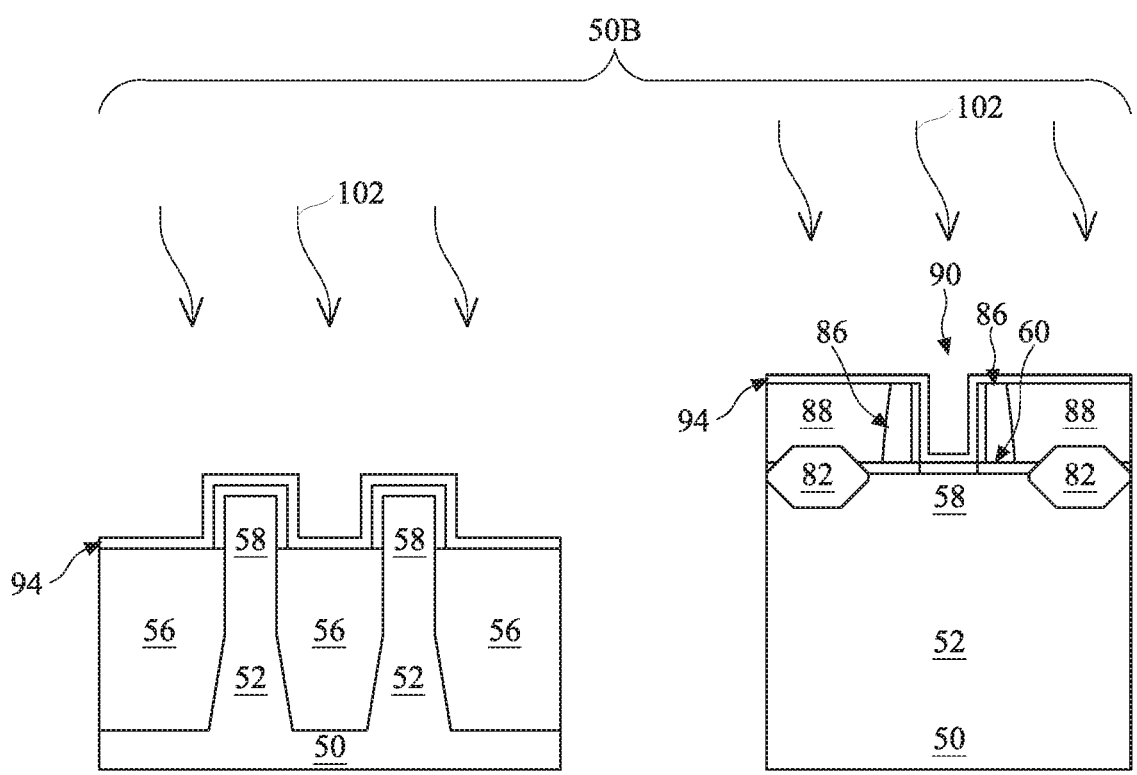
FIGS. 23A, 23B, 23C, and 23D are cross-sectional views of intermediate stages in the manufacturing of FinFETs in accordance with some embodiments.
Figures 23C, 23D:
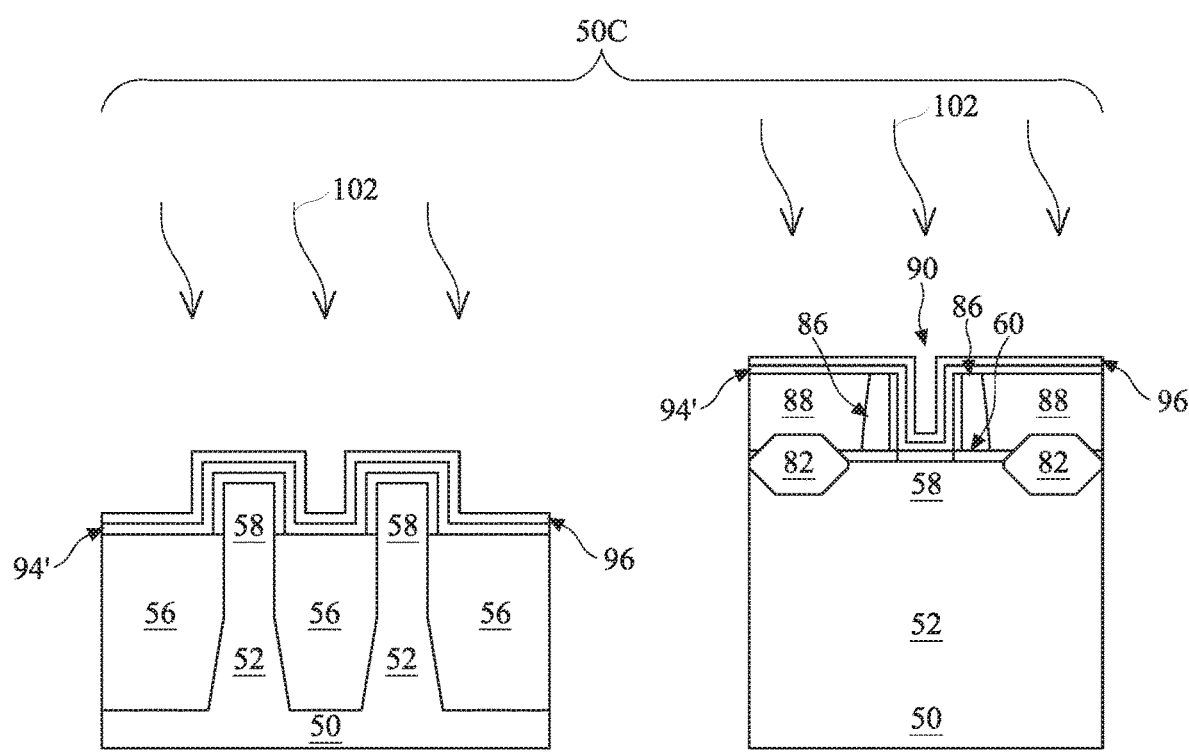
Figures 24A, 24B:
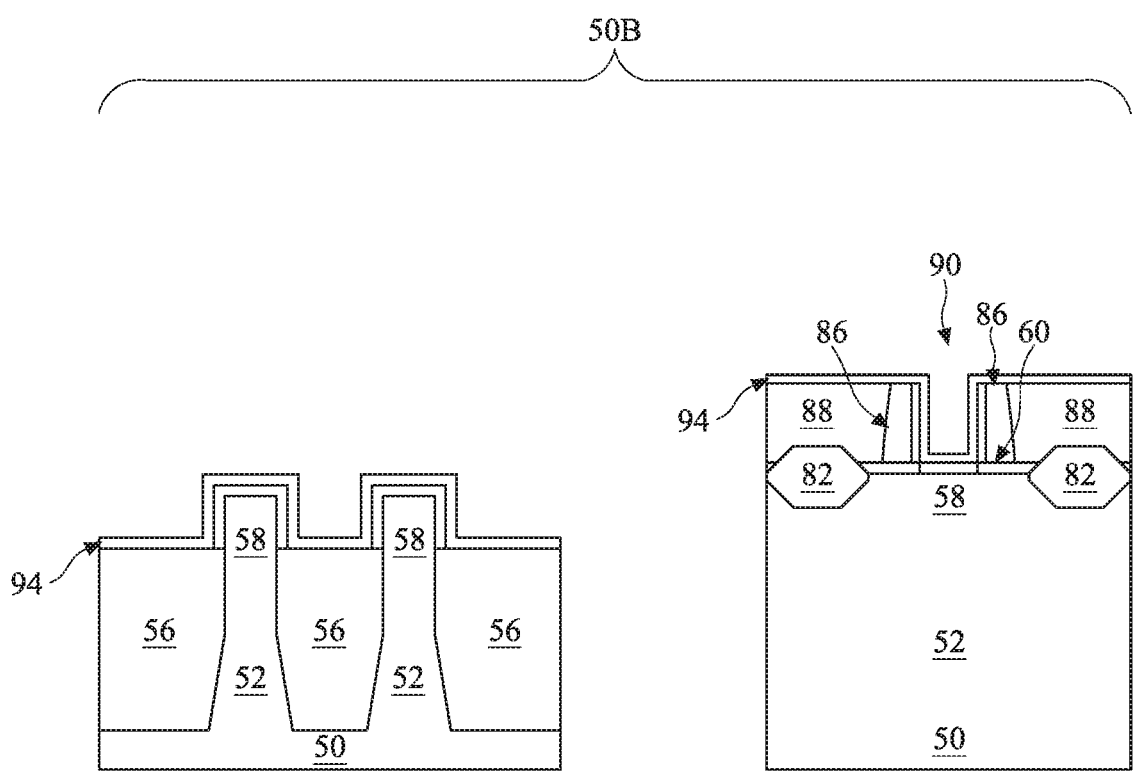
Figures 25A, 25B:
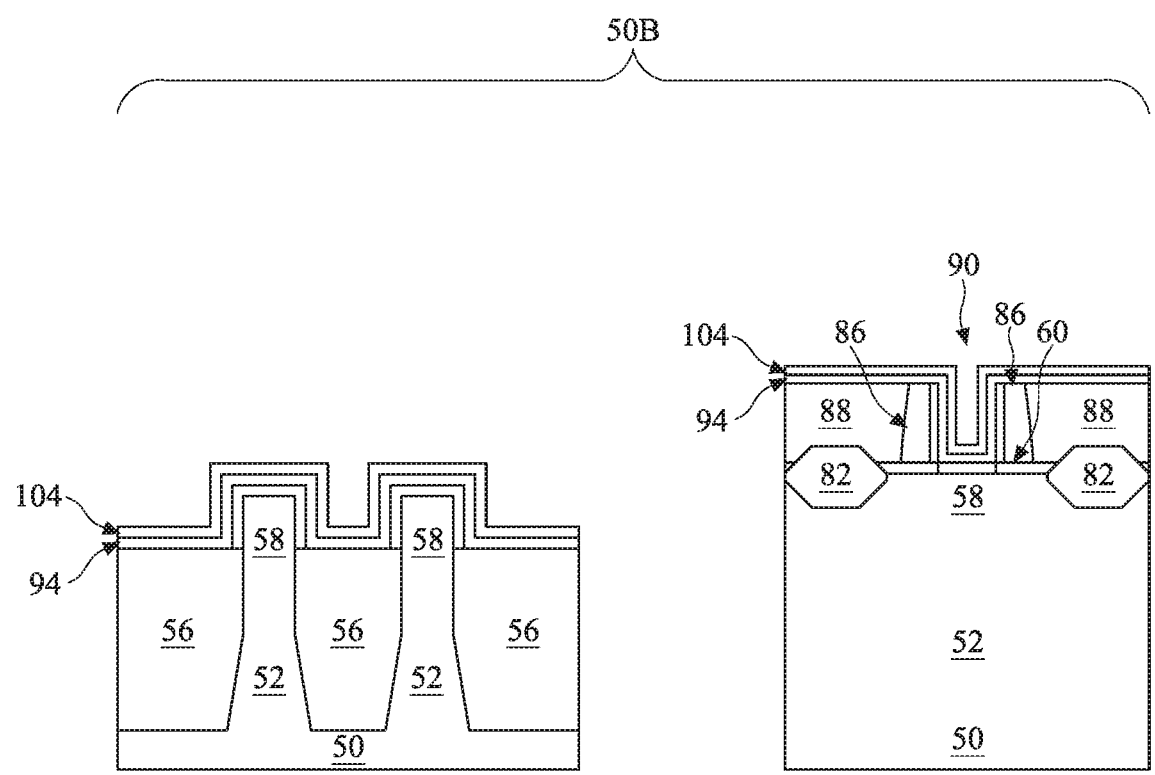

As shown in FIGS. 23C-D, the anneal process 102 causes ions to diffuse from the metal oxide layer 96 in region 50C into gate dielectric layer 94 in region 50C, creating doped gated dielectric layer 94'. For example, metal oxide layer 96 may include lanthanum oxide. During the anneal process 102, lanthanum ions may diffuse from the lanthanum-containing metal oxide layer 96 into gate dielectric layer 94, creating a lanthanum-doped gate dielectric layer 94'. In some embodiments, lanthanum-doped gate dielectric layer 94' may comprise a concentration of lanthanum of about 5%-atomic to about 95%-atomic. In some embodiments, lanthanum-doped gate dielectric layer 94' may comprise a concentration of lanthanum of less than about 30%-atomic. In some embodiments, lanthanum-doped gate dielectric layer 94' may comprise a concentration of lanthanum of about 70%-atomic. The lanthanum-doped gate dielectric layer 94' in region 50C (i.e. the PMOS region) may enable some devices to have improved electrical characteristics. For example, in some devices, a lanthanum-doped gate dielectric layer 94' may allow for a device having improved electrical characteristics. For example, a PMOS device comprising lanthanum doped gate dielectric layer 94' may have a voltage threshold that may be more closely matched to a voltage threshold of an NMOS device. Additionally, design requirements of certain devices may result in devices with smaller gate dimensions. A device comprising lantha-num-doped gate dielectric layer 94' may allow for a gate stack to be formed in the device with a better fill and smaller or reduced gaps in the gate stack.

After the anneal process 102 is complete, the remaining metal oxide layer 96 in region 50C is removed, for example using an etching process. The resulting structure is shown in FIGS. 24A-D. The gate dielectric layer 94 in region 50B is substantially unchanged by the anneal process 102, as the metal oxide layer 96 in region 50B was removed prior to the anneal process 102. The gate dielectric layer 94 in region 50C has been doped to form doped gate dielectric layer 94'.

Next, a work function layer 104 is formed over the gate dielectric layer 94 in region 50B and the doped gate dielectric layer 94' in region 50C. The work function layer 104 is depicted in FIGS. 25A-D. In some embodiments, the work function layer 104 may include titanium, silicon, oxygen and/or nitrogen, including but not limited to TiSiN, TiN, SiC, SiN, SiOx, SiOCx, or the like. For example, the work function layer 104 may include titanium doped with silicon and/or nitrogen. The work function layer may include titanium nitride doped with silicon in some embodiments. The work function layer 104 may be formed by deposition, such as by CVD, ALD, or the like. In some embodiments, the work function layer 104 includes titanium, silicon, and nitrogen, and adhesion of the work function layer 104 to the underlying doped gate dielectric layer 94' is improved. Although depicted as a single layer, in some embodiments work function layer 104 may comprise more than one work function layer.

Figure 26:
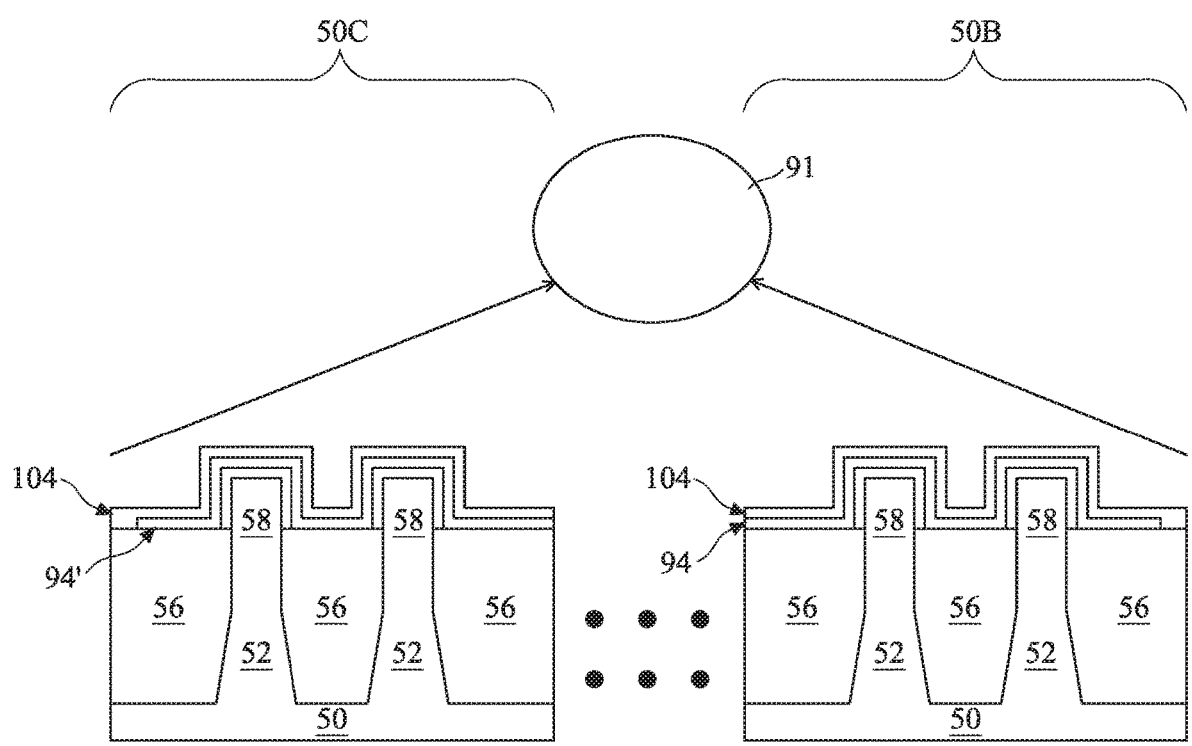
FIG. 26 illustrates cross-sectional views of intermediate stages in the manufacturing of FinFETs in accordance with some embodiments.
Figures 27A, 27B:
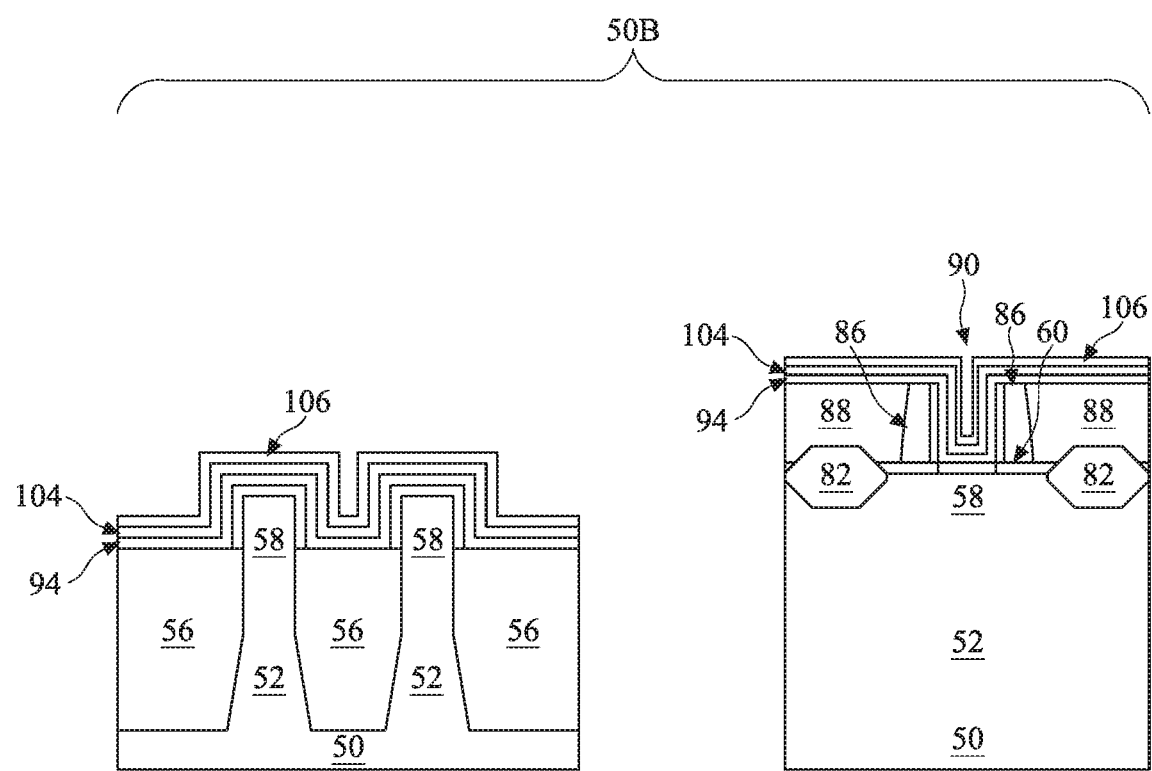
Figures 28A, 28B:
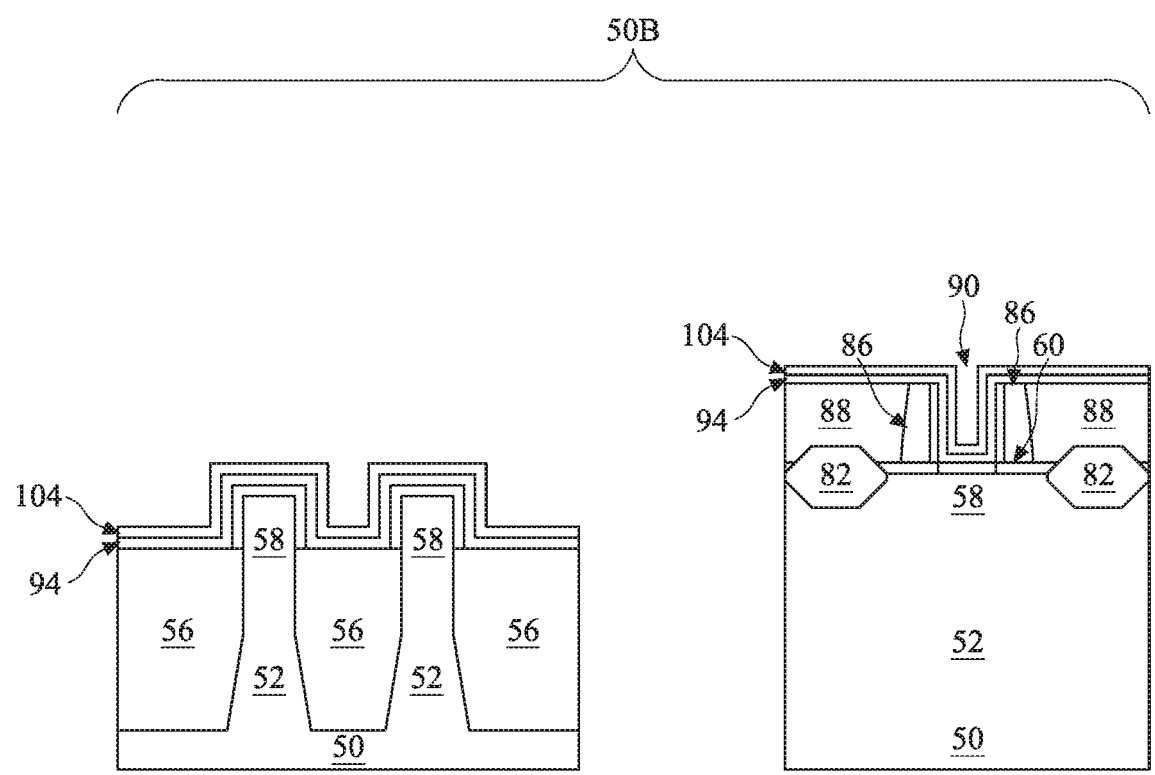

FIG. 26 depicts the deposition of the work function layer 104 at the edge of wafer 91 in accordance with some embodiments. As discussed above in connection with FIG. 15, gate dielectric layer 94 may be deposited in a manner that creates a bevel along the edge of wafer 91. After gate dielectric layer 94 is deposited, in subsequent processing gate dielectric layer 94 may be doped, creating doped gate dielectric layer 94'. In some embodiments, doped gate dielectric layer 94' may be doped with lanthanum oxide, creating lanthanum-doped gate dielectric layer 94'.

However, lanthanum oxide is soluble and easily dissolved in water. If lanthanum oxide doped gate dielectric layer 94' is exposed during cleaning processes, such as a backside cleaning process that may be performed subsequently to the forming of the lanthanum oxide doped gate dielectric layer 94', lanthanum-doped gate dielectric layer 94' may dissolve or partially dissolve. The dissolving of the lanthanum oxide doped gate dielectric layer 94' may contaminate a production tool being used and negatively impact a production line, creating additional costs and production delays.

To protect the lanthanum oxide doped gate dielectric layer 94', the work function layer 104 at the edge of wafer 91 is formed so that the work function layer 104 surrounds the exposed sidewalls of lanthanum oxide doped gate dielectric layer 94' at the wafer edge and removes the bevel. As such, lanthanum oxide doped gate dielectric layer 94' is not exposed to a cleaning process, and/or exposure of the lanthanum oxide doped gate dielectric layer 94' during a subsequent cleaning process is minimized. As such, production costs and production delays may be minimized.

Referring to FIGS. 27A-D, a silicon cap 106 is formed over the work function layer 104, for example by a deposition process or the like. In some embodiments, an anneal process may be formed after silicon cap 106 is formed over the work function layer. An anneal process may enable work function layer 104 to be doped with silicon. In some embodiments, the anneal process may increase a concentration of silicon in work function layer by about 5% to about 95%, such as about 25%. After the anneal process, work function layer 104 may have a concentration of silicon of about 5% to about 95%, such as about 25%.

Silicon cap 106 may protect work function layer 104 during a backside cleaning process that is subsequently performed. In some embodiments, the backside cleaning process may consume all or part of silicon cap 106, exposing work function layer 104 to one or more solutions used for the backside cleaning process. In some embodiments, work function layer 104 may also be partially consumed during the backside cleaning process, which may expose gate dielectric layer 94 and/or doped gate dielectric layer 94' to one or more solutions used for the backside cleaning process. After the backside cleaning process is performed, any remaining portions of silicon cap 106 are removed. The resulting structure is depicted in FIGS. 28A-D.

Figure 29:
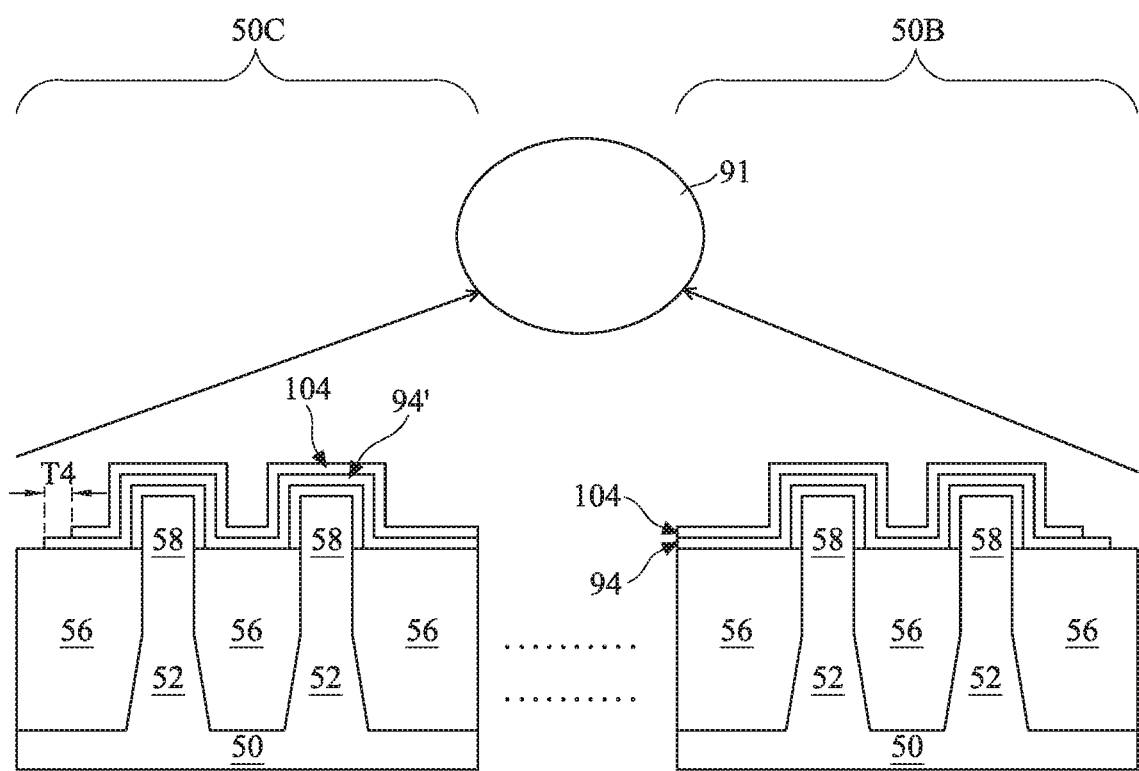
FIGS. 29 and 30 illustrate cross-sectional views of intermediate stages in the manufacturing of FinFETs in accordance with some embodiments.
Figure 30:
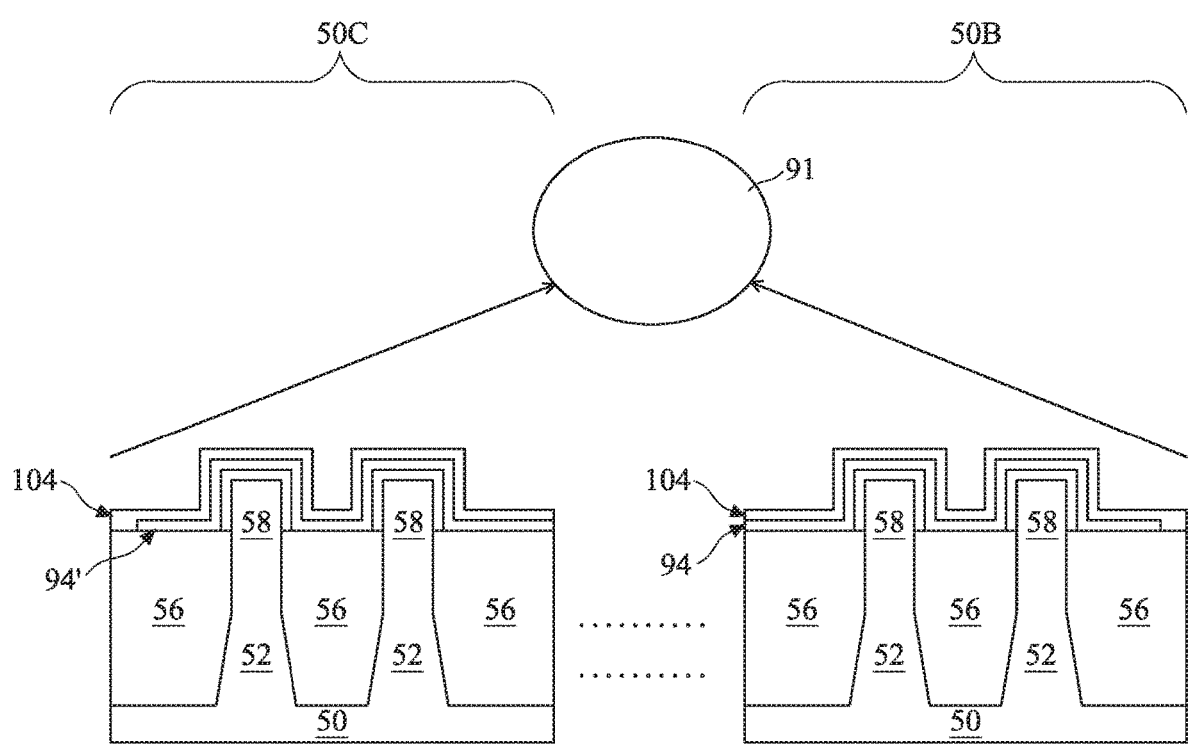
Figures 31A, 31B:
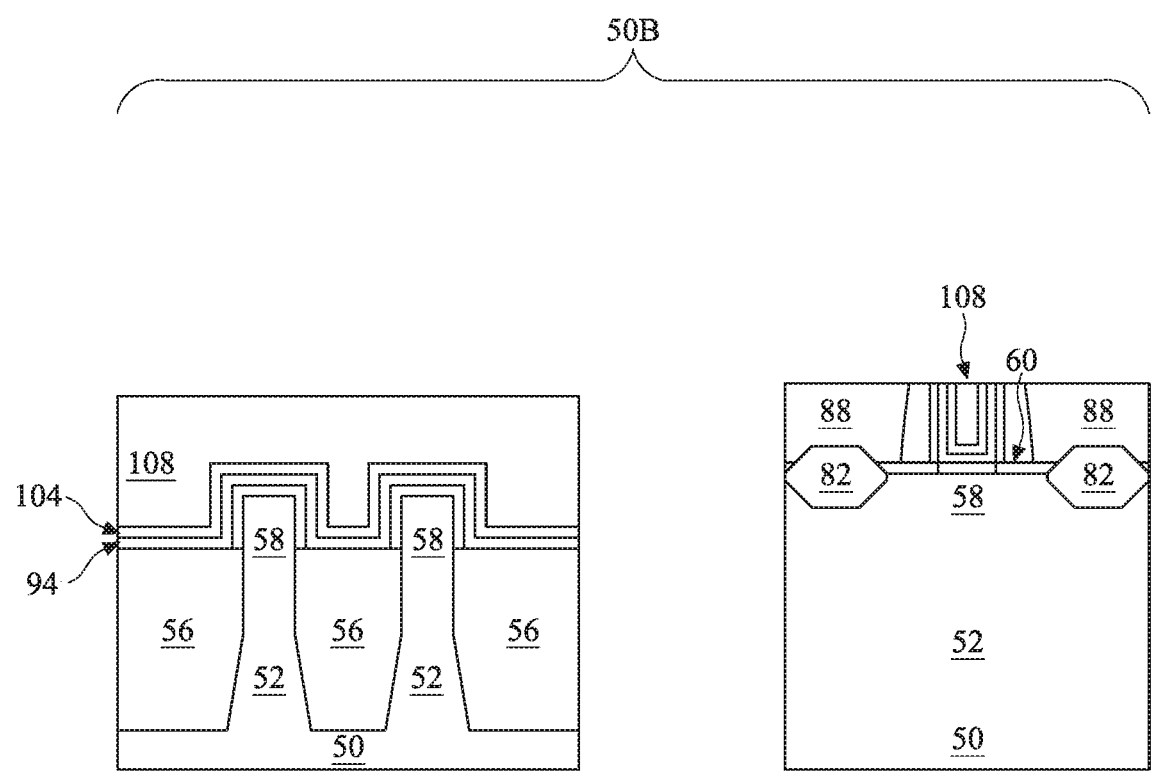
FIGS. 31A, 31B, 31C, and 31D are cross-sectional views of intermediate stages in the manufacturing of FinFETs in accordance with some embodiments.
Figures 31C, 31D:
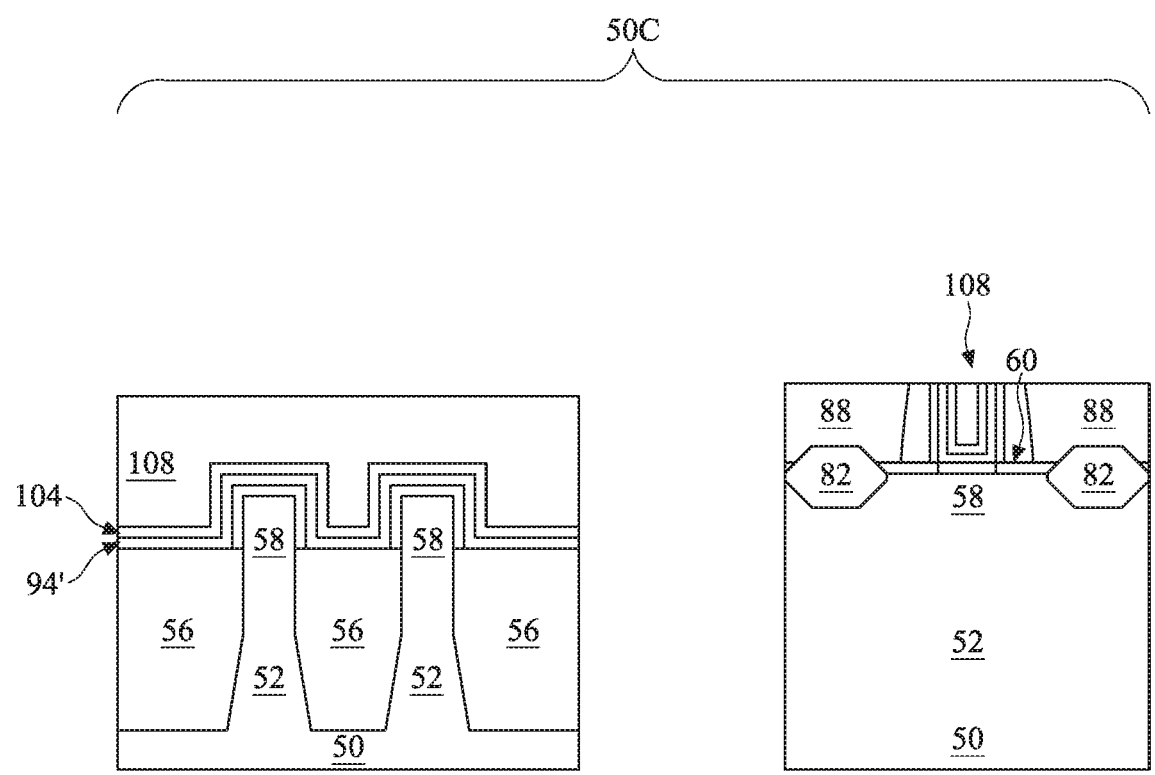
Figures 32A, 32B:
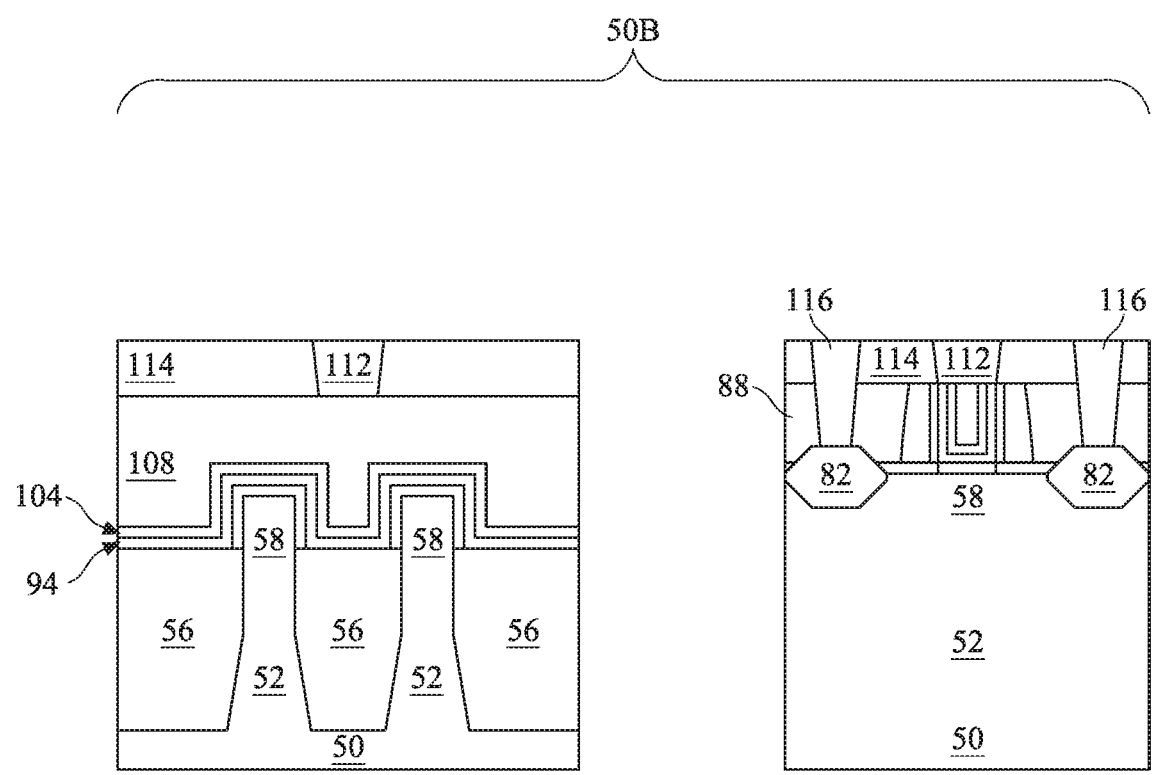
FIGS. 32A, 32B, 32C, and 32D are cross-sectional views of intermediate stages in the manufacturing of FinFETs in accordance with some embodiments.
Figures 32C, 32D:
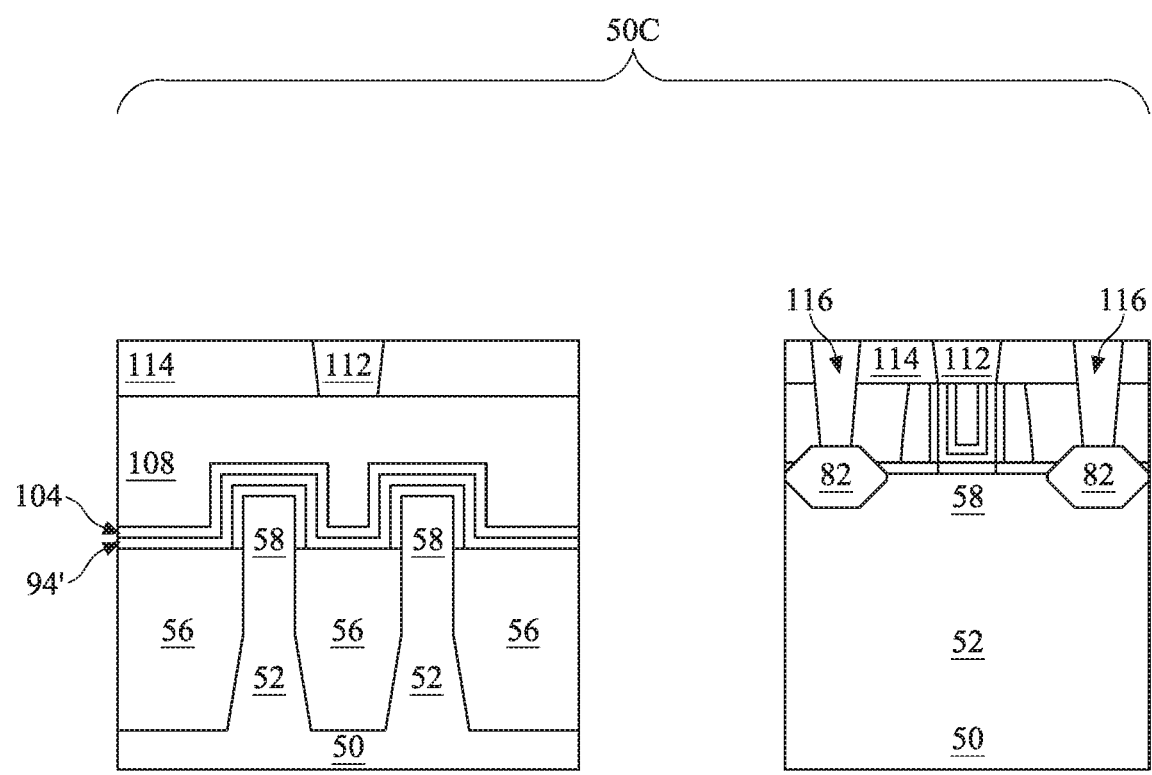

FIGS. 29 and 30 depict multiple FinFETs being formed along an edge of wafer 91, after the backside cleaning and removal of silicon cap 106, in accordance with some embodiments. In some embodiments, a solution that is used for the backside cleaning may cause damage to silicon cap 106 and/or work function layer 104 during the backside cleaning as depicted in FIG. 29.

As discussed above, in some embodiments LaCl may be used as a precursor to form metal oxide layer 96. $LaCl_x$ compounds may diffuse into doped gate dielectric layer 94', for example during the anneal process. After work function layer 104 is formed over doped gate dielectric layer 94', $LaCl_x$ compounds may diffuse into work function layer 104. $LaCl_x$ compounds may create defects in work function layer 104. In some embodiments, the backside cleaning process may use diluted hydrofluoric acid (dHF). The dHF solution may remove $TiSi_xO_xN_x$ and $TiF_y$ compounds of work function layer 104. If a dHF solution used in a backside cleaning process contacts $LaCl_x$ compounds in work function layer 104, for example after silicon cap 106 has been consumed, then F elements in the dHF solution may interact with the $LaCl_x$ compounds and increase the defects in work function layer 104. As such, the backside cleaning may consume work function layer 104 more easily, at least partially because of the defects. When work function layer 104 is consumed, gate dielectric layer 94 and/or doped gate dielectric layer 94' may be exposed, and doped gate dielectric layer 94' may dissolve or partially dissolve during the backside cleaning.

FIG. 29 depicts an embodiment in which a backside cleaning solution, such as dHF, has consumed work function layer 104 along an edge of wafer 91, for example because of defects in work function layer 104. As such, after the backside cleaning process is removed and silicon cap 106 is removed, work function layer 104 is recessed from the sidewall of the wafer 91, and doped gate dielectric layer 94' may be partially exposed. In some embodiments, a sidewall of work function layer 104 may be recessed a distance T4 from a sidewall of doped gate dielectric layer 94', where T4 is about 0.5 μm to about 5 mm.

In some embodiments, one or more solutions used in the backside cleaning process may be selected to reduce damage to work function layer 104. For example, a $DICO_2$ solution may be used in addition to the dHF solution. The $DICO_2$ solution may contact work function layer 104 after silicon cap 106 is consumed (at least in part) during the backside cleaning process. The $DICO_2$ solution may remove any $LaCl_x$ compounds exposed along the surface of work function layer 104. As such, the dHF solution may be used during the backside cleaning process without increasing defects in work function layer 104.

FIG. 30 depicts an embodiment in which a backside cleaning solution has been selected to minimize defects in work function layer 104. As shown in FIG. 30, when defects in work function layer 104 are minimized during the backside cleaning process, after the backside cleaning process is completed and silicon cap 106 is removed, work function layer 104 covers the sidewalls of doped gate dielectric layer 94' and contacts STI regions 56 in the bevel. Because doped gate dielectric layer 94' is protected by work function layer 104 and/or silicon cap 106 during the backside cleaning process, doped gate dielectric layer 94' is not dissolved by the chemicals used for the backside cleaning process, or the dissolving of the doped gate dielectric layer 94' is minimized. As such, contamination of the production tool being used is minimized, and costs and/or delays may be reduced.

FIGS. 31A-D depict cross-sectional views of FinFET devices being formed away from a wafer edge. In some embodiments, gate electrodes 108 are formed for replacement gates. The gate electrodes 108 are deposited over the work function layer 104, respectively, and fill the remaining portions of the recesses 90. The gate electrodes 108 may be a metal-containing material such as W, TiN, TaN, TaC, Co, Ru, Al, combinations thereof, or multi-layers thereof. For example, although a single gate electrode 108 and work function layer 104 is illustrated, any number of work function layers may be deposited in the recesses 90. After the filling of the gate electrodes 108, a planarization process, such as a CMP, may be performed to remove the excess portions of the gate dielectric layers 94/94', work function layer 104, and the material of the gate electrodes 108, which excess portions are over the top surface of the ILD 88. The remaining portions of material of the gate electrodes 108 and the gate dielectric layers 94/94' and the work function layers 104 thus form replacement gates of the resulting FinFETs. The gate electrodes 108, the work function layer 104, and the gate dielectric layers 94/94' may be collectively referred to as a "gate" or a "gate stack." The gate and the gate stacks may extend along sidewalls of a channel region of the fins 58.

The formation of the gate electrodes 108 may occur simultaneously such that the gate electrodes 108 in each region are formed from the same materials. In some embodiments, the gate electrodes 108 in each region may be formed by distinct processes, such that the gate electrodes 108 may be different materials. Various masking steps may be used to mask and expose appropriate regions when using distinct processes.

In FIGS. 32A-D, an ILD 114 is deposited over the ILD 88. In an embodiment, the ILD 114 is a flowable film formed by a flow able CVD method. In some embodiments, the ILD 114 is formed of a dielectric material such as PSG, BSG, BPSG, USG, or the like, and may be deposited by any suitable method, such as CVD and PECVD. Contacts 112 and 116 are formed through the ILD 114 and/or the ILD 88. In some embodiments, an anneal process may be performed to form a silicide at the interface between the epitaxial source/drain regions 82 and the contacts 116 prior to the contacts 116 being formed. The contact 112 is physically and electrically connected to the gate electrode 108, and the contacts 116 are physically and electrically connected to the epitaxial source/drain regions 82. FIGS. 32A-D illustrate the contacts 116 and 112 in a same cross-section; however, in other embodiments, the contacts 116 and 112 may be disposed in different cross-sections. Furthermore, the contacts 116 may be formed prior to, simultaneously with, or after forming the contacts 112.

As discussed herein, an anneal process may be performed to cause ions to diffuse from a metal oxide layer into an underlying gate dielectric layer, creating a doped gate dielectric layer. In some embodiments, the metal oxide layer may include lanthanum oxide, and the anneal process may cause an underlying gate dielectric layer to be doped with lanthanum. The lanthanum-doped gate dielectric layer may enable some FinFET devices, such as PMOS devices, to have improved electrical characteristics. In PMOS devices, a lanthanum-doped gate dielectric layer may allow for PMOS devices having improved electrical characteristics. For example, a PMOS device comprising a lanthanum-doped gate dielectric layer may have a voltage threshold that may be more closely matched to a voltage threshold of an NMOS device. Additionally, design requirements of certain PMOS devices may result in PMOS devices with smaller gate dimensions. A PMOS device comprising a lanthanum-doped gate dielectric layer may allow for a gate stack to be formed in the PMOS device with a better fill and smaller or reduced gaps in the gate stack.

As described herein, lanthanum oxide is water soluble, and a lanthanum-doped gate dielectric layer may be vulnerable to bring dissolved during chemical cleaning processes, such as a backside cleaning process that may be performed subsequently to the forming of the lanthanum-doped gate dielectric layer. At a wafer edge, a work function layer may be formed overlying the lanthanum-doped gate dielectric layer so that the work function layer covers sidewalls of the lanthanum-doped gate dielectric layer and protects the lanthanum-doped gate dielectric layer from exposure to cleaning chemicals during cleaning processes. As such, dissolving of the lanthanum-doped gate dielectric layer during a chemical cleaning process may be reduced or prevented.

A method is provided in accordance with some embodiments. The method includes forming a gate dielectric layer and depositing a metal oxide layer over the gate dielectric layer. The method also includes annealing the gate dielectric layer and the metal oxide layer, causing ions to diffuse from the metal oxide layer to the gate dielectric layer to form a doped gate dielectric layer. The method also includes forming a work function layer over the doped gate dielectric layer and forming a gate electrode over the work function layer. In an embodiment the metal oxide layer includes lanthanum oxide, and lanthanum ions diffuse from the metal oxide layer to the gate dielectric layer. In an embodiment annealing the gate dielectric layer and the metal oxide layer includes raising the temperature of the gate dielectric layer and the metal oxide layer to a temperature of about 300° C. to about 550° C. In an embodiment the anneal process has a duration of about 1 minute to about 3 minutes. In an embodiment the method also includes forming a silicon cap over the work function layer; performing a backside cleaning process; and removing the silicon cap. In an embodiment the method further includes annealing the silicon cap, the annealing causing silicon ions to diffuse from the silicon cap into the work function layer. In an embodiment the work function layer covers sidewalls of the doped gate dielectric layer along an edge of a wafer underlying the doped gate dielectric layer. In an embodiment the work function layer comprises titanium, silicon, and nitrogen. In an embodiment the method further includes removing the metal oxide layer after the annealing. In an embodiment the metal oxide layer is deposited in a first region and a second region, and the metal oxide layer is removed from the second region before the annealing.

A method is provided in accordance with some embodiments. The method includes depositing a gate dielectric layer over a first region and a second region. The method also includes forming a metal oxide layer over in the gate dielectric layer in the first region and the second region. The method includes removing the metal oxide layer from the second region. The method also includes annealing the gate dielectric layer and the remaining metal oxide layer to form a doped gate dielectric layer. The method also includes removing the remaining metal oxide layer from the first region. The method also includes depositing a work function layer on the doped gate dielectric layer, and forming a gate electrode over the work function layer. In an embodiment the metal oxide layer includes lanthanum oxide, and the doped gate dielectric layer is doped with lanthanum. In an embodiment the method also includes, removing a dummy gate to form a recess, where the gate dielectric layer is deposited in the recess. In an embodiment the method also includes forming a silicon cap over the work function layer, and annealing the silicon cap. In an embodiment the gate dielectric layer overlies a shallow trench isolation (STI) region, and a sidewall of the gate dielectric layer is recessed from a sidewall of the STI region. In an embodiment the work function layer covers a sidewall of the doped gate dielectric layer after it is deposited.

A device is provided in accordance with some embodiments. The device includes a fin protruding from a substrate. A lanthanum-doped gate dielectric layer is over the fin, wherein the lanthanum-doped gate dielectric layer comprises a concentration of lanthanum that is less than about 95% percent. A gate electrode is over the lanthanum-doped gate dielectric layer. In an embodiment the device also includes an interfacial layer over the fin, where the lanthanum-doped gate dielectric layer overlies the interfacial layer. In an embodiment the device also includes a work function layer over the lanthanum-doped gate dielectric layer, where the gate electrode overlies the work function layer. In an embodiment the work function layer is doped with silicon.

A device is provided in accordance with some embodiments. The device includes a first fin protruding from a substrate, a lanthanum-doped gate dielectric layer over the first fin, and a gate electrode over the lanthanum-doped gate dielectric layer. The lanthanum-doped gate dielectric layer includes a concentration of lanthanum that is less than about 95 at %.

A device is provided in accordance with some embodiments. The device includes a first fin and a second fin protruding from a substrate, a first gate dielectric layer extending along sidewalls and a top surface of the first fin, and a second gate dielectric layer extending along sidewalls and a top surface of the second fin. The second gate dielectric layer has a higher concentration of lanthanum than the first gate dielectric layer.

A device is provided in accordance with some embodiments. The device includes a first fin extending from a major surface of a substrate and a first gate stack over the first fin. The first gate stack includes a first gate dielectric layer over the first fin and a first gate electrode over the first gate dielectric layer. The first gate dielectric layer includes a first dielectric material. The device further includes a second fin extending from the major surface of the substrate and a second gate stack over the second fin. The second gate stack includes a second gate dielectric layer over the second fin and a second gate electrode over the second gate dielectric layer. The second gate dielectric layer includes the first dielectric material doped with lanthanum. A concentration of lanthanum in the second gate dielectric layer is between about 5 at % and about 95 at %.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first fin protruding from a substrate;
a lanthanum-doped gate dielectric layer over the first fin, wherein the lanthanum-doped gate dielectric layer comprises a concentration of lanthanum that is less than about 95 at %;
a gate electrode over the lanthanum-doped gate dielectric layer; and
a work function layer over the lanthanum-doped gate dielectric layer, wherein the gate electrode overlies the work function layer, and wherein the work function layer is doped with silicon.

2. The device of claim 1, further comprising an interfacial layer over the first fin, wherein the lanthanum-doped gate dielectric layer overlies the interfacial layer.

3. The device of claim 1, wherein the work function layer covers a sidewall of the lanthanum-doped gate dielectric layer.

4. The device of claim 1, wherein the work function layer is further doped with nitrogen.

5. The device of claim 1, further comprising:
a second fin protruding from the substrate; and
a second gate dielectric layer over the second fin, wherein the second gate dielectric layer has a lower concentration of lanthanum than the lanthanum-doped gate dielectric layer.

6. The device of claim 1, wherein the work function layer has a concentration of silicon between about 5% and about 95%.

7. The device of claim 1, wherein the work function layer comprises titanium.

8. A device comprising:
a first fin and a second fin protruding from a substrate;
a first gate dielectric layer extending along sidewalls and a top surface of the first fin;
a second gate dielectric layer extending along sidewalls and a top surface of the second fin, the second gate dielectric layer having a higher concentration of lanthanum than the first gate dielectric layer;
a first isolation region adjacent the first fin, wherein the top surface of the first fin is above a top surface of the first isolation region; and
a first work function layer over the first gate dielectric layer, wherein the first work function layer is in physical contact with the top surface of the first isolation region.

9. The device of claim 8, wherein a concentration of lanthanum in the second gate dielectric layer is between about 5 at % and about 95 at %.

10. The device of claim 8, further comprising:
a second isolation region adjacent the second fin, wherein the top surface of the second fin is above a top surface of the second isolation region.

11. The device of claim 10, further comprising:
a second work function layer over the second gate dielectric layer.

12. The device of claim 11, wherein the first work function layer and the second work function layer comprise a same material.

13. The device of claim 11, wherein the second work function layer is in physical contact with the top surface of the second isolation region.

14. The device of claim 8, further comprising a first gate electrode over the first work function layer.

15. A device comprising:
a first fin extending from a major surface of a substrate;
a first gate stack over the first fin, the first gate stack comprising:
a first gate dielectric layer over the first fin, the first gate dielectric layer comprising a first dielectric material;
a first gate electrode over the first gate dielectric layer; and
a first work function layer interposed between the first gate dielectric layer and the first gate electrode, wherein the first work function layer has a concentration of silicon between about % and about 95%;
a second fin extending from the major surface of the substrate; and
a second gate stack over the second fin, the second gate stack comprising:
a second gate dielectric layer over the second fin, the second gate dielectric layer comprising the first dielectric material doped with lanthanum, wherein a concentration of lanthanum in the second gate dielectric layer is between about 5 at % and about 95 at %; and
a second gate electrode over the second gate dielectric layer.

16. The device of claim 15, wherein the first gate electrode and the second gate electrode comprise a same material.

17. The device of claim 15, further comprising:
a second work function layer interposed between the second gate dielectric layer and the second gate electrode.

18. The device of claim 17, wherein the first work function layer and the second work function layer comprise a same material.

19. The device of claim 17, wherein the first work function layer is in physical contact with a sidewall of the first gate dielectric layer, and wherein the second work function layer is in physical contact with a sidewall of the second gate dielectric layer.

20. The device of claim 15, wherein the first work function layer comprises titanium nitride doped with silicon.

* * * * *

UNITED STATES PATENT AND TRADEMARK OFFICE
CERTIFICATE OF CORRECTION

PATENT NO. : 10,867,799 B2
APPLICATION NO. : 16/701805
DATED : December 15, 2020
INVENTOR(S) : Chun Chieh Wang et al.

Page 1 of 1

It is certified that error appears in the above-identified patent and that said Letters Patent is hereby corrected as shown below:

In the Claims

In Column 18, Line 30, Claim 15, delete "about %" and insert --about 5%--.

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*